(12) United States Patent
Shin et al.

(10) Patent No.: US 11,601,110 B2
(45) Date of Patent: Mar. 7, 2023

(54) BULK-ACOUSTIC WAVE RESONATOR

(71) Applicant: Samsung Electro-Mechanics Co., Ltd., Suwon-si (KR)

(72) Inventors: Ran Hee Shin, Suwon-si (KR); Tae Kyung Lee, Suwon-si (KR); Je Hong Kyoung, Suwon-si (KR); Jin Suk Son, Suwon-si (KR); Hwa Sun Lee, Suwon-si (KR); Sung Sun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 795 days.

(21) Appl. No.: 16/356,333

(22) Filed: Mar. 18, 2019

(65) Prior Publication Data
US 2020/0036359 A1    Jan. 30, 2020

(30) Foreign Application Priority Data

Jul. 24, 2018  (KR) .......................... 10-2018-0085889

(51) Int. Cl.
| | | |
|---|---|---|
| *H03H 9/13* | (2006.01) | |
| *H01L 41/047* | (2006.01) | |
| *H01L 41/187* | (2006.01) | |
| *H03H 9/02* | (2006.01) | |
| *H01L 41/316* | (2013.01) | |
| *H03H 9/17* | (2006.01) | |

(Continued)

(52) U.S. Cl.
CPC .............. *H03H 9/13* (2013.01); *C22C 21/00* (2013.01); *H01L 41/0477* (2013.01); *H01L 41/187* (2013.01); *H01L 41/316* (2013.01); *H03H 3/02* (2013.01); *H03H 9/02031* (2013.01); *H03H 9/174* (2013.01); *H03H 9/176* (2013.01); *H03H 9/54* (2013.01); *H03H 2003/023* (2013.01)

(58) Field of Classification Search
CPC .......... H03H 9/13; H03H 9/174; H03H 9/176; H03H 9/02031; H01L 41/0477
See application file for complete search history.

(56) References Cited

U.S. PATENT DOCUMENTS

| | | | |
|---|---|---|---|
| 2006/0214539 A1 | 9/2006 | Sato | |
| 2007/0013268 A1* | 1/2007 | Kubo | ................. H03H 9/02133 310/365 |

(Continued)

FOREIGN PATENT DOCUMENTS

| | | |
|---|---|---|
| JP | 2007-181185 A | 7/2007 |
| JP | 4548171 B2 | 9/2010 |
| KR | 10-2018-0015338 A | 2/2018 |

*Primary Examiner* — Bryan P Gordon
(74) *Attorney, Agent, or Firm* — NSIP Law

(57) ABSTRACT

A bulk-acoustic wave resonator includes a substrate, a first electrode disposed on the substrate, a piezoelectric layer, of which at least a portion is disposed on the first electrode, a second electrode disposed on the piezoelectric layer, and a passivation layer disposed to cover the first electrode and the second electrode. Either one or both of the first electrode and the second electrode includes an aluminum alloy layer. Either one or both of the piezoelectric layer and the passivation layer has aluminum nitride, or aluminum nitride added with a doping material, having a ratio of an out-of-plane lattice constant "c" to an in-plane lattice constant "a" (c/a) of less than 1.58.

16 Claims, 20 Drawing Sheets
(3 of 20 Drawing Sheet(s) Filed in Color)

(51) Int. Cl.
*C22C 21/00* (2006.01)
*H03H 3/02* (2006.01)
*H03H 9/54* (2006.01)

(56) References Cited

U.S. PATENT DOCUMENTS

| | | | |
|---|---|---|---|
| 2007/0188270 A1* | 8/2007 | Ohara | H03H 9/605 333/189 |
| 2010/0148637 A1* | 6/2010 | Satou | H03H 3/02 310/367 |
| 2013/0127300 A1* | 5/2013 | Umeda | H01L 41/316 310/365 |
| 2014/0175950 A1* | 6/2014 | Zou | H03H 9/131 310/365 |
| 2015/0084719 A1* | 3/2015 | Umeda | H03H 9/02086 333/187 |
| 2016/0189797 A1* | 6/2016 | Yamamoto | G09G 3/3677 377/64 |
| 2018/0041189 A1* | 2/2018 | Lee | H03H 9/54 |

* cited by examiner

BULK-ACOUSTIC WAVE RESONATOR

CROSS-REFERENCE TO RELATED APPLICATION

This application claims benefit under 35 USC 119(a) of priority to Korean Patent Application No. 10-2018-0085889 filed on Jul. 24, 2018 in the Korean Intellectual Property Office, the entire disclosure of which is incorporated herein by reference for all purposes.

BACKGROUND

1. Field

The present disclosure relates to a bulk-acoustic wave resonator.

2. Description of Related Art

Recent interest in 5G communications technology has increased the development of technologies capable of being implemented in candidate bands.

Frequency bands currently being implemented in a film bulk-acoustic wave resonator (FBAR) is about 6 GHz or less. In an example of a film type bulk-acoustic wave resonator operating in the frequency band of 2 to 3 GHz, the thickness of the electrode and the piezoelectric layer is relatively large, so that the film type bulk-acoustic wave resonator can be easily manufactured. In an example of a film type bulk-acoustic wave resonator operating in the frequency band of 5 GHz, significant process difficulty and performance degradation are expected.

In particular, in an example of a film bulk-acoustic wave resonator operating in the frequency band of 5 GHz, since an ultra-thin electrode should typically be realized, the thickness of a piezoelectric layer may also be relatively thin. In order to realize such an ultra-thin electrode, the electrode may be formed of a material such as aluminum (Al).

However, when an electrode is formed of a soft material such as aluminum (Al), there may be a problem in which a surface defect, such as a void, may occur in an electrode disposed in a position lower than a position of a piezoelectric layer and/or a passivation layer, since migration of materials (particles) constituting the electrode during deposition of the piezoelectric layer and/or the passivation layer may occur. Furthermore, a surface defect such as a void may occur in the piezoelectric layer and/or the passivation layer due to the surface defects occurred in the electrodes.

SUMMARY

This Summary is provided to introduce a selection of concepts in a simplified form that are further described below in the Detailed Description. This Summary is not intended to identify key features or essential features of the claimed subject matter, nor is it intended to be used as an aid in determining the scope of the claimed subject matter.

According to an aspect of the present disclosure, a bulk-acoustic wave resonator includes a substrate; a first electrode disposed on the substrate; a piezoelectric layer, of which at least a portion is disposed on the first electrode; a second electrode disposed on the piezoelectric layer; and a passivation layer disposed to cover the first electrode and the second electrode, wherein either one or both of the first electrode and the second electrode includes an aluminum alloy layer, either one or both of the piezoelectric layer and the passivation layer has aluminum nitride, or aluminum nitride added with a doping material, having a ratio of an out-of-plane lattice constant "c" to an in-plane lattice constant "a" (c/a) of less than 1.58.

In the bulk-acoustic wave resonator, the aluminum alloy layer may contain scandium (Sc).

In the bulk-acoustic wave resonator, the content of scandium (Sc) may be 0.1 to 5 at %.

In the bulk-acoustic wave resonator, the doping material of the piezoelectric layer and the passivation layer may include one selected from the group consisting of scandium, erbium, yttrium, lanthanum, titanium, zirconium, and hafnium, or combinations thereof.

In the bulk-acoustic wave resonator, the content of the doping material of the piezoelectric layer and the passivation layer may be 0.1 to 30 at %.

In the bulk-acoustic wave resonator, the either one or both of the piezoelectric layer and the passivation layer may be subjected to tensile stress when stacked.

In the bulk-acoustic wave resonator, the first electrode and the second electrode both may include an aluminum alloy layer containing scandium (Sc).

In the bulk-acoustic wave resonator, the first electrode may include a layer formed of any one of, or a layer formed of an alloy including any one selected from the group consisting of, molybdenum (Mo), ruthenium (Ru), tungsten (W), iridium (Ir), platinum (Pt), copper (Ti), tantalum (Ta), nickel (Ni), and chromium (Cr), the second electrode may include an aluminum alloy layer containing scandium (Sc).

In the bulk-acoustic wave resonator, the first electrode may include an aluminum alloy layer containing scandium (Sc), the second electrode may include a layer formed of any one of, or a layer formed of an alloy including any one selected from the group consisting of, molybdenum (Mo), ruthenium (Ru), tungsten (W), iridium (Ir), platinum (Pt), copper (Ti), tantalum (Ta), nickel (Ni), and chromium (Cr).

In the bulk-acoustic wave resonator, the first electrode may include a 1-1 electrode layer including a layer formed of any one of, or a layer formed of an alloy including any one selected from the group consisting of, molybdenum (Mo), ruthenium (Ru), tungsten (W), iridium (Ir), platinum (Pt), copper (Ti), tantalum (Ta), nickel (Ni), and chromium (Cr), and a 1-2 electrode layer disposed in an upper portion of the 1-1 electrode layer and including an aluminum alloy layer containing scandium (Sc).

In the bulk-acoustic wave resonator, the first electrode may include a 1-1 electrode layer including an aluminum alloy layer containing scandium (Sc), and a 1-2 electrode layer disposed in an upper portion of the 1-1 electrode layer and including a layer formed of any one of, or a layer formed of an alloy including any one selected from the group consisting of, molybdenum (Mo), ruthenium (Ru), tungsten (W), iridium (Ir), platinum (Pt), copper (Ti), tantalum (Ta), nickel (Ni), and chromium (Cr).

In the bulk-acoustic wave resonator, the second electrode may include a 2-1 electrode layer including a layer formed of any one of, or a layer formed of an alloy including any one selected from the group consisting of, molybdenum (Mo), ruthenium (Ru), tungsten (W), iridium (Ir), platinum (Pt), copper (Ti), tantalum (Ta), nickel (Ni), and chromium (Cr), and a 2-2 electrode layer disposed in an upper portion of the 2-1 electrode layer and including an aluminum alloy layer containing scandium (Sc).

In the bulk-acoustic wave resonator, the second electrode may include a 2-1 electrode layer including an aluminum alloy layer containing scandium (Sc), and a 2-2 electrode layer disposed in an upper portion of the 2-1 electrode layer and including a layer formed of any one of, or a layer formed of an alloy including any one selected from the group consisting of, molybdenum (Mo), ruthenium (Ru), tungsten (W), iridium (Ir), platinum (Pt), copper (Ti), tantalum (Ta), nickel (Ni), and chromium (Cr).

In the bulk-acoustic wave resonator, the second electrode may include a 2-1 electrode layer including a layer formed of any one of, or a layer formed of an alloy including any one selected from the group consisting of, molybdenum (Mo), ruthenium (Ru), tungsten (W), iridium (Ir), platinum (Pt), copper (Ti), tantalum (Ta), nickel (Ni), and chromium (Cr), and a 2-2 electrode layer disposed in an upper portion of the 2-1 electrode layer and including an aluminum alloy layer containing scandium (Sc).

In the bulk-acoustic wave resonator, the second electrode may include a 2-1 electrode layer including an aluminum alloy layer containing scandium (Sc), and a 2-2 electrode layer disposed in an upper portion of the 2-1 electrode layer and including a layer formed of any one of, or a layer formed of an alloy including any one selected from the group consisting of, molybdenum (Mo), ruthenium (Ru), tungsten (W), iridium (Ir), platinum (Pt), copper (Ti), tantalum (Ta), nickel (Ni), and chromium (Cr).

In the bulk-acoustic wave resonator, the second electrode may include a 2-1 electrode layer including a layer formed of any one of, or a layer formed of an alloy including any one selected from the group consisting of, molybdenum (Mo), ruthenium (Ru), tungsten (W), iridium (Ir), platinum (Pt), copper (Ti), tantalum (Ta), nickel (Ni), and chromium (Cr), and a 2-2 electrode layer disposed in an upper portion of the 2-1 electrode layer and including an aluminum alloy layer containing scandium (Sc).

In the bulk-acoustic wave resonator, the second electrode may include a 2-1 electrode layer including an aluminum alloy layer containing scandium (Sc), and a 2-2 electrode layer disposed in an upper portion of the 2-1 electrode layer and including a layer formed of any one of, or a layer formed of an alloy including any one selected from the group consisting of, molybdenum (Mo), ruthenium (Ru), tungsten (W), iridium (Ir), platinum (Pt), copper (Ti), tantalum (Ta), nickel (Ni), and chromium (Cr).

In the bulk-acoustic wave resonator, the doping material of the piezoelectric layer may include one selected from the group consisting of scandium, erbium, yttrium, lanthanum, titanium, zirconium, and hafnium, or combinations thereof, the passivation layer may be a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

Other features and aspects will be apparent from the following detailed description, the drawings, and the claims.

BRIEF DESCRIPTION OF DRAWINGS

The patent or application file contains at least one drawing executed in color. Copies of this patent or patent application publication with color drawing(s) will be provided by the Office upon request and payment of the necessary fee.

Throughout the drawings and the detailed description, the same reference numerals refer to the same elements. The drawings may not be to scale, and the relative size, proportions, and depiction of elements in the drawings may be exaggerated for clarity, illustration, and convenience.

DETAILED DESCRIPTION

Figure 1:
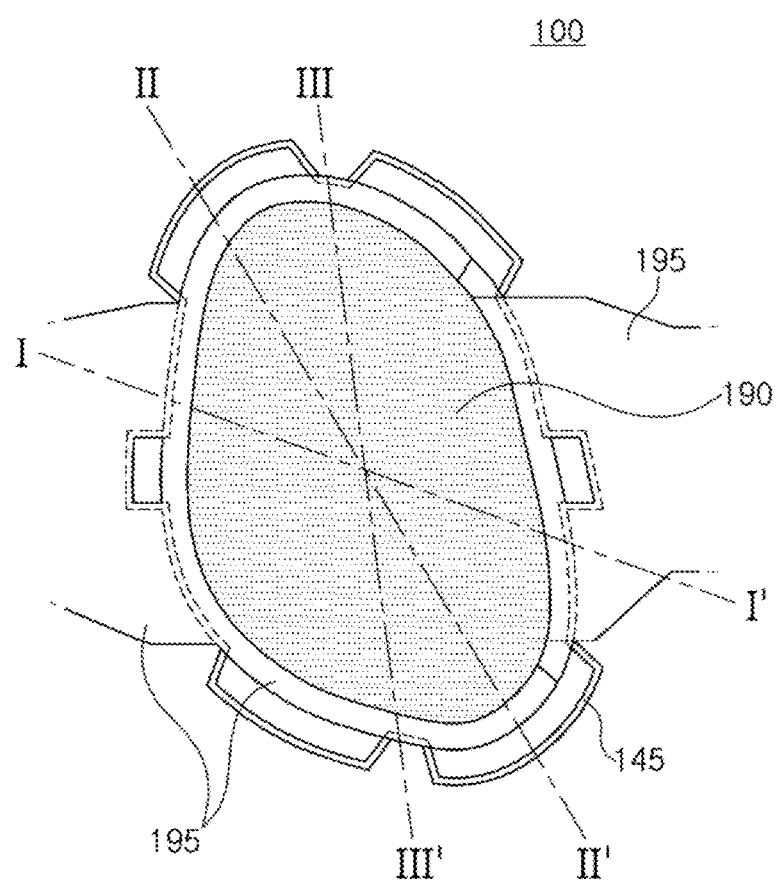
FIG. 1 is a schematic plan view illustrating an example of a bulk-acoustic wave resonator.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of the disclosure of this application. For example, the sequences of operations described herein are merely examples, and are not limited to those set forth herein, but may be changed as will be apparent after an understanding of the disclosure of this application, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of the disclosure of this application.

Throughout the specification, when an element, such as a layer, region, or substrate, is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms such as "above," "upper," "below," and "lower" may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above" or "upper" relative to another element will then be "below" or "lower" relative to the other element. Thus, the term "above" encompasses both the above and below orientations depending on the spatial orientation of the device. The device may also be oriented in other ways (for example, rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

The features of the examples described herein may be combined in various ways as will be apparent after an understanding of the disclosure of this application. Further, although the examples described herein have a variety of configurations, other configurations are possible as will be apparent after an understanding of the disclosure of this application.

Figure 2:
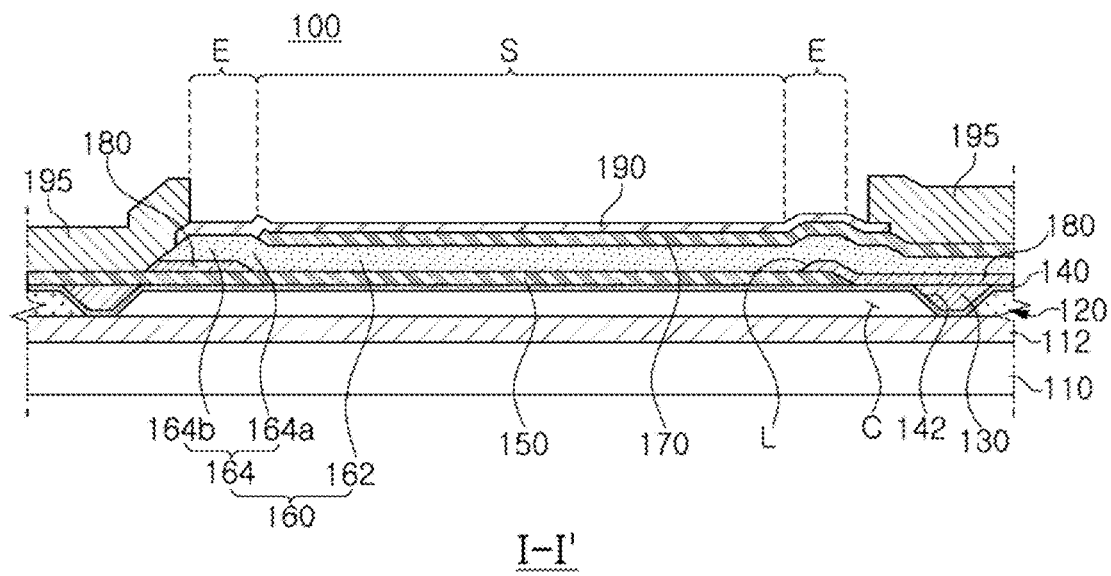
FIG. 2 is a cross-sectional view taken along line I-I' in FIG. 1.
Figure 3:
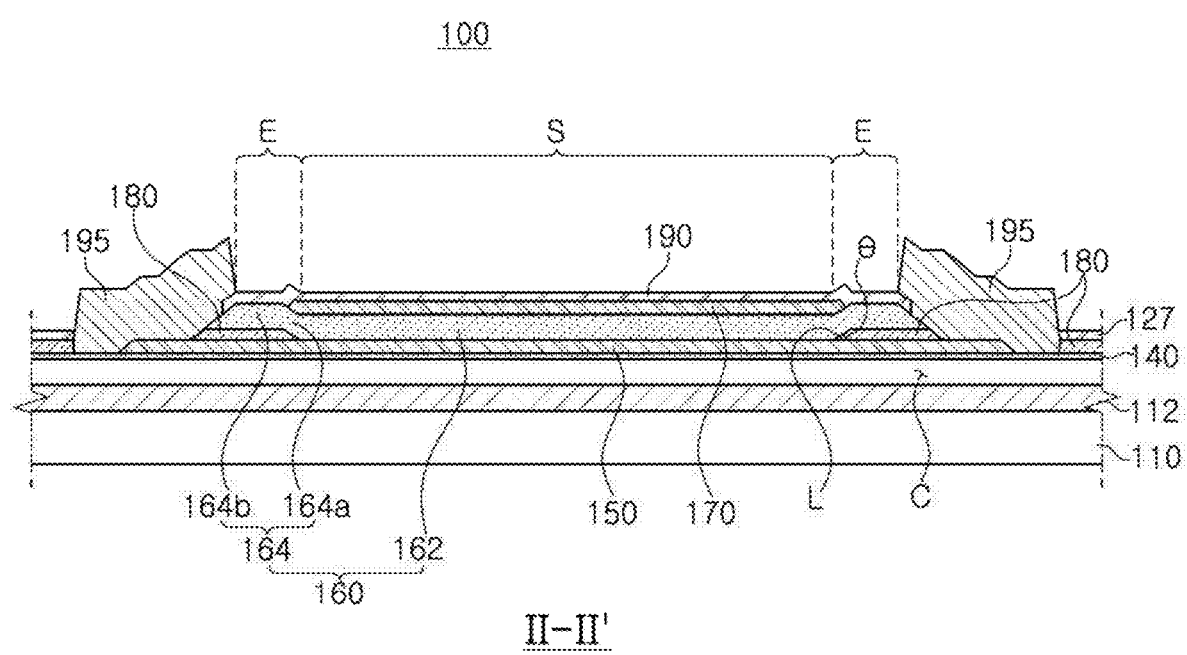
FIG. 3 is a cross-sectional view taken along line II-II' in FIG. 1.
Figure 4:
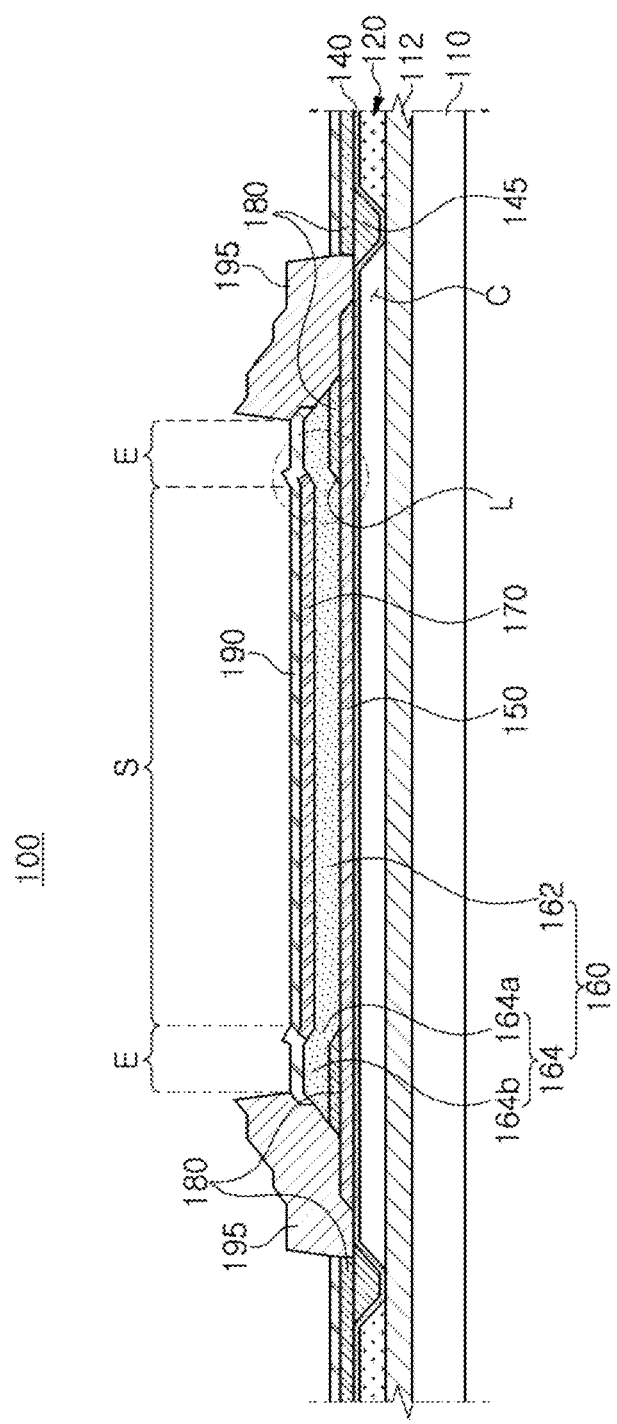
FIG. 4 is a cross-sectional view taken along line III-III' in FIG. 1.

FIG. 1 is a schematic plan view illustrating an example of a bulk-acoustic wave resonator; FIG. 2 is a cross-sectional view taken along line I-I' in FIG. 1; FIG. 3 is a cross-sectional view taken along line II-II' in FIG. 1; and FIG. 4 is a cross-sectional view taken along line III-III' in FIG. 1.

Referring to FIGS. 1 to 4, a bulk-acoustic wave resonator 100 according to an example of the present disclosure may include a substrate 110, a sacrificial layer 120, an etching prevention portion 130, a membrane layer 140, a first electrode 150, a piezoelectric layer 160, a second electrode 170, an insertion layer 180, a passivation layer 190, and a metal pad 195, as one example.

The substrate 110 may be a silicon substrate. For example, as the substrate 110, a silicon wafer may be used, or a silicon on insulator (SOI) type substrate may be used.

An insulation layer 112 may be formed on an upper surface of the substrate 110, and may electrically isolate the substrate 110 from configurations formed in a position above the substrate. The insulation layer 112 may also function to prevent the substrate 110 from being etched by etching gas, when a cavity C is formed during the manufacturing process.

In this example, the insulation layer 112 may be formed of any one or any combination of any two or more of silicon dioxide ($SiO_2$), silicon nitride ($Si_3N_4$), aluminum oxide ($Al_2O_2$), and aluminum nitride (AlN), and may be formed by any one or any combination of any two or more of a chemical vapor deposition process, a RF magnetron sputtering process, and an evaporation process.

The sacrificial layer 120 may be formed on the insulation layer 112, and the cavity C and the etching prevention portion 130 may be disposed inside the sacrificial layer 120. The cavity C may be formed by removing a portion of the sacrificial layer 120 during the manufacturing process. As described above, as the cavity C is formed inside the sacrificial layer 120, the first electrode 150, and the like, disposed in a position above the sacrificial layer 120 may be formed in a flat shape.

The etching prevention portion 130 may be disposed along a boundary of the cavity C. The etching prevention portion 130 may prevent etching from proceeding beyond an area of the cavity in a process of forming the cavity C.

The membrane layer 140 may form the cavity C together with the substrate 110. In addition, the membrane layer 140 may be formed of a material having a low reactivity with the etching gas, when the sacrificial layer 120 is removed. The etching prevention portion 130 may be inserted into a groove 142 formed by the membrane layer 140. A dielectric layer containing any one of silicon nitride (Si$_3$N$_4$), silicon oxide (SiO$_2$), manganese oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO) may be used as the membrane layer 140.

A seed layer (not illustrated) formed of aluminum nitride (AlN) may be formed on the membrane layer 140. For example, the seed layer may be disposed between the membrane layer 140 and the first electrode 150. The seed layer may be formed using a dielectric or a metal having an HCP crystal structure in addition to aluminum nitride (AlN). As an example, when the seed layer is a metal, the seed layer may be formed of titanium (Ti).

The first electrode 150 may be formed on the membrane layer 140, and a portion thereof may be disposed on an upper portion of the cavity C. In addition, the first electrode 150 may be used as either an input electrode or an output electrode for inputting and outputting an electrical signal such as a radio frequency (RF) signal, and the like.

The first electrode 150 may be formed of an aluminum alloy material containing scandium (Sc) as an example. As described above, since the first electrode 150 is formed of an aluminum alloy material containing scandium (Sc), mechanical strength may be increased, and high power reactive sputtering may also be achieved. Under such deposition conditions, an increase of a surface roughness of the first electrode 150 may be prevented, and high orientation growth of the piezoelectric layer 160 may be induced.

In addition, since the scandium (Sc) is contained to increase chemical resistance of the first electrode 150, disadvantages occurring when the first electrode is formed of pure aluminum may be supplemented. In addition, process stability such as a dry etching process or a wet etching process in manufacturing may be secured. Further, in the example in which the first electrode is formed of pure aluminum, oxidation may be easily caused. Since the first electrode 150 is formed of an aluminum alloy material containing scandium, the chemical resistance to oxidation may be improved.

Referring to the above in further detail, the sheet resistance may be measured when an electrode is formed of a molybdenum (Mo) material, and an aluminum alloy (AlSc) material containing scandium, to have a thickness of 1500 Å. In the example in which the electrode is formed of a molybdenum (Mo) material, the sheet resistance thereof may be 0.9685. In the example in which the electrode is formed of an aluminum alloy (AlSc) material containing 0.625 at % of scandium, the sheet resistance thereof may be 0.316. As described above, the sheet resistance of an electrode formed of an aluminum alloy (AlSc) material may be lower than that of an electrode formed of a molybdenum (Mo) material.

The content of scandium (Sc) may be 0.1 at % to 5 at %. For example, in the example in which the content of scandium (Sc) is less than 0.1 at %, mechanical property deterioration and hillock caused by aluminum (Al) may occur. In the example in which the content of scandium (Sc) is 5 at % or more, electrical loss representing the sheet resistance may be difficult to be improved. In addition, in the example in which the content of scandium (Sc) increases, the surface roughness may increase to adversely affect the crystal orientation.

TABLE 1

| Material | Yield Strength | Elongation |
| --- | --- | --- |
| Pure Aluminum | 35 Mpa | 45% |
| AlSc (Sc 0.625at %) | 300 Mpa | 15% |

As shown in Table 1, the aluminum alloy containing scandium (AlSc, 0.625 at %) may increase yield strength and decrease elongation, compared with the pure aluminum (Al) material.

Figure 5:
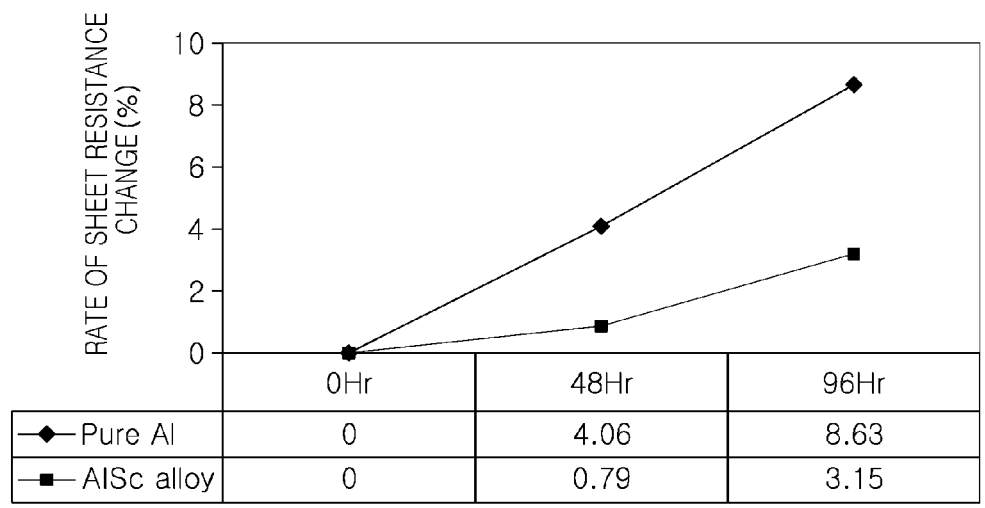
FIG. 5 is a graph illustrating an example of a rate of sheet resistance change of an aluminum alloy containing pure aluminum and scandium.

As illustrated in FIG. 5, the sheet resistance was measured in a reliable environment by depositing a pure aluminum (Al) material and an aluminum alloy containing scandium (AlSc, 0.625 at %) to have a thickness of 1500 Å. As a result, in view of a rate of sheet resistance change after 96 Hr, the aluminum alloy (AlSc, 0.625 at %) material containing scandium shows about 50% change compared to, and thus is better in oxidation resistance than the pure aluminum (Al) material.

The first electrode 150 may be also excellent in galvanic corrosion resistance with respect to the metal pad 195, such that stability in the manufacturing process may be obtained. For example, a pure aluminum (Al) material, and an aluminum alloy (AlSc, 0.625 at %) material containing scandium may be deposited to have a thickness of 1500 Å, may be in contact with gold (Au), which is mainly used as a material of the metal pad 195, and may be then immersed in an electrolyte solution for 65 hours. As a result of comparison of galvanic corrosion characteristics, no change in surface was observed in the example of aluminum alloy (AlSc, 0.625 at %) material containing scandium, but in the example of pure aluminum (Al) material, corrosion with gold (Au) was observed. Therefore, in the example in which the first electrode 150 may be formed of an aluminum alloy (AlSc) material containing scandium, the characteristics of galvanic corrosion may be secured in the manufacturing process.

The first electrode 150 may be formed of an aluminum alloy (AlSc) containing only scandium (Sc). For example, no additional metal except scandium (Sc) may be contained. When additional metals other than scandium (Sc) are contained, these aluminum alloys may form a ternary system in a phase diagram. In this example, since it is difficult to control the composition, and a relatively complicated phase system is formed, compositional unevenness and an undesired crystal phase may be formed.

Furthermore, in the example in which the first electrode 150 is formed of an aluminum alloy having a ternary system, the surface roughness may be increased due to uneven composition and undesired crystal phase formation, which may adversely affect the crystal orientation when the piezoelectric layer 160 is formed.

Therefore, since the first electrode 150 is formed of an aluminum alloy (AlSc) containing only scandium (Sc), the crystal orientation of the piezoelectric layer 160 disposed on the first electrode 150 may be improved.

The piezoelectric layer 160 may be formed to cover at least a portion of the first electrode 150 disposed in a position above the cavity C. The piezoelectric layer 160 may be a portion causing a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). In particular, in the example in which the piezoelectric layer 160 is formed of aluminum nitride (AlN), the piezoelectric layer 150 may further include a rare earth metal. As an example, the rare earth metal may include any one or any combination of any two or more of scandium (Sc), erbium (Er), yttrium (Y), and lanthanum (La). In addition, as an example, the transition metal may include any one or any combination of any two or more of titanium (Ti), zirconium (Zr), hafnium (Hf), tantalum (Ta), and niobium (Nb). Magnesium (Mg), which is a divalent metal, may also be included.

The content of the elements included in the aluminum nitride (AlN) for improving the piezoelectric characteristics is preferably 0.1 to 30 at %. In the example in which the content of elements included in the piezoelectric material is less than 0.1 at %, piezoelectric characteristics higher than that of aluminum nitride (AlN) may not be realized. When the content of the elements included to improve the piezoelectric properties exceeds 30 at %, formation and control of the composition for deposition may be difficult and a non-uniform phase may be formed. In addition, in the example in which the content of the elements exceeds 30 at %, probability of abnormal grain growth may rapidly increase, and serious surface defects may thus occur in the piezoelectric layer 160.

The piezoelectric layer 160 may include a piezoelectric portion 162 disposed in a flat portion S, and a bent portion 164 disposed in an extension portion E.

The piezoelectric portion 162 may be a portion directly stacked on the upper surface of the first electrode 150. Therefore, the piezoelectric portion 162 may be disposed between the first electrode 150 and the second electrode 170, and may be formed in a flat shape, together with the first electrode 150 and the second electrode 170.

The bent portion 164 may be defined as a portion extending outward from the piezoelectric portion 162, and may be located in the extension portion E.

The bent portion 164 may be disposed on the insertion layer 180 to be described later, and may be formed in a shape raising along a shape of the insertion layer 180. The piezoelectric layer 160 may be bent at the boundary between the piezoelectric portion 162 and the bent portion 164, and the bent portion 164 may be raised corresponding to a thickness and a shape of the insertion layer 180.

The bent portion 164 may be divided into an inclined portion 164a and an extended portion 164b.

The inclined portion 164a refers to a portion formed to be inclined along an inclined surface L of the insertion layer 180 to be described later. The extended portion 164b refers to a portion extending outward from the inclined portion 164a.

The inclined portion 164a may be formed parallel to the inclined surface L of the insertion layer 180, and an inclination angle of the inclined portion 164a may be formed to be equal to an inclination angle (θ in FIG. 3) of the inclined surface L.

Meanwhile, when the piezoelectric layer 160 is stacked, tensile stress may be applied to the piezoelectric layer 160. The tensile stress applied to the piezoelectric layer 160 may be 0 to 500 MPa. In this example, in the example that the piezoelectric layer 160 may be formed of aluminum nitride, or aluminum nitride containing a doping element, c/a, which is a ratio of an in-plane lattice constant "a" to an out-of-plane lattice constant "c," may be less than 1.58. As described above, since tensile stress of 0 to 500 MPa may be applied to the piezoelectric layer 160, occurrence of voids in the first electrode 150 may be prevented. For example, migration of the materials (particles) constituting the first electrode 150 may be prevented, and occurrence of surface defects may be prevented.

Figure 6:
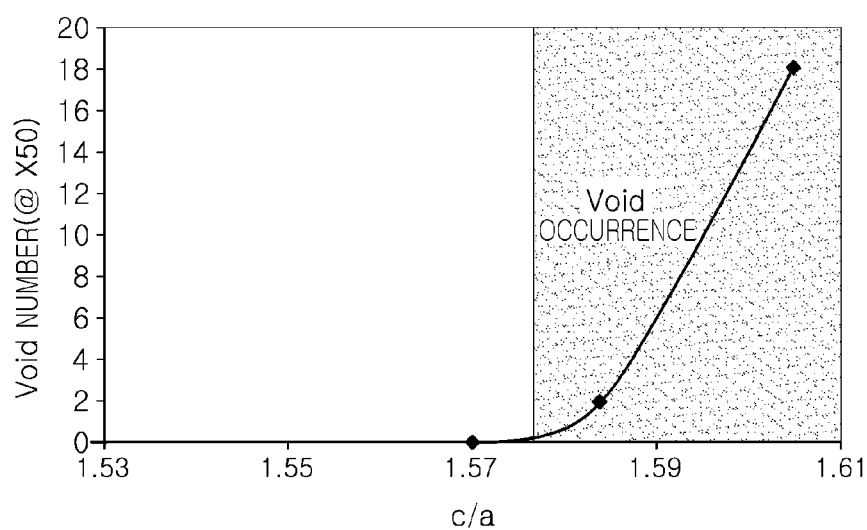
FIG. 6 is a graph illustrating an example of whether surface defects according to a ratio of lattice constants of aluminum nitride containing a doped material occur.

Meanwhile, as illustrated in FIG. 6, when a ratio (c/a) of lattice constants is approximately greater than 1.58, the number of void occurrence in the first electrode 150 may increase sharply. When a ratio (c/a) of lattice constants is less than 1.58, tensile stress may be applied to prevent void occurrence in the first electrode 150.

As described above, when the piezoelectric layer 160 is stacked, tensile stress may be applied to the piezoelectric layer 160. Therefore, a ratio (c/a) of lattice constants of the piezoelectric layer 160 may be less than 1.58.

The second electrode 170 may be formed to cover at least a portion of the piezoelectric layer 160 disposed in a position above the cavity C. The second electrode 170 may be used as either an input electrode or an output electrode for inputting and outputting an electrical signal such as a radio frequency (RF) signal, and the like. For example, in the example in which the first electrode 150 is used as an input electrode, the second electrode 170 may be used as an output electrode, and in the example that the first electrode 150 is used as an output electrode, the second electrode 170 may be used as an input electrode.

The second electrode 170 may be formed of an aluminum alloy material containing scandium (Sc), in a similar manner to the first electrode 150.

The second electrode 170 may be formed of an aluminum alloy (AlSc) containing only scandium (Sc). For example, no additional metal, except scandium (Sc), may be contained. When additional metals other than scandium (Sc) are contained, these aluminum alloys may form a ternary system in a phase diagram. In this example, since it is difficult to control the composition, and a relatively complicated phase system is formed, compositional unevenness and an undesired crystal phase may be formed.

Furthermore, in the example in which the second electrode 170 is formed of an aluminum alloy having a ternary system, the surface roughness may be increased due to uneven composition and undesired crystal phase formation, which may adversely affect the crystal orientation when the passivation layer 190 is formed.

Therefore, since the second electrode 170 is formed of an aluminum alloy (AlSc) containing only scandium (Sc), the crystal orientation of the passivation layer 190 disposed on the second electrode 170 may be improved.

The insertion layer 180 may be disposed between the first electrode 150 and the piezoelectric layer 160. The insertion layer 180 may be formed of a dielectric, such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), but may be formed of a material different from those of the piezoelectric layer 160. In addition, an area in which the insertion layer 180 is provided may be formed as an air if necessary. This may be accomplished by removing the insertion layer 180 during the manufacturing process.

In this example, a thickness of the insertion layer 180 may be the same as or similar to a thickness of the first electrode 150. The insertion layer 180 may be formed to be thinner than the piezoelectric layer 160, or may be formed to similar to the piezoelectric layer 160. For example, the insertion layer 180 may be formed to have a thickness of 100 Å or more, and may be formed to be thinner than a thickness of the piezoelectric layer 160. The configuration of the present disclosure is not limited thereto.

The insertion layer 180 may be disposed along a surface formed by the membrane layer 140, the first electrode 150, and the etching prevention portion 130.

The insertion layer 180 may be disposed around the flat portion S to support the bent portion 164 of the piezoelectric layer 160. The bent portion 164 of the piezoelectric layer 160 may be divided into the inclined portion 164a and the extended portion 164b, depending on a shape of the insertion layer 180.

The insertion layer 180 may be disposed in an area other than the flat portion S. For example, the insertion layer 180 may be disposed over the entire area except the flat portion S, or may be disposed in a partial area.

At least a portion of the insertion layer 180 may be disposed between the piezoelectric layer 160 and the first electrode 150.

A side surface of the insertion layer 180 disposed along the boundary of the flat portion S may be formed in a thicker form, as a distance from the flat portion S increases. The insertion layer 180 may be formed of an inclined surface L such that a side surface to be disposed adjacent to the flat portion S has a constant inclination angle θ.

In the example that the inclination angle θ of the side surface of the insertion layer 180 is less than 5 degrees, a thickness of the insertion layer 180 should be made very thin or an area of the inclined surface L should be excessively large, to manufacture the insertion layer 180. Therefore, it may be difficult to be substantially realized.

In addition, in the example that the inclination angle θ of the side surface of the insertion layer 180 is formed wider than 70 degrees, an inclination angle of the inclined portion 164a of the piezoelectric layer 160 stacked on the insertion layer 180 may be formed to be wider than 70 degrees. In this example, since the piezoelectric layer 160 may be excessively bent, a crack may occur in the bent portion of the piezoelectric layer 160.

Therefore, in this example, the inclination angle θ of the inclined surface L may be formed in a range of 5 degrees or more and 70 degrees or less.

The passivation layer 190 may be formed in an area except for a portion of the first electrode 150 and the second electrode 170. The passivation layer 190 may prevent damage of the second electrode 170 and the first electrode 150 during the manufacturing process.

Furthermore, the passivation layer 190 may be partially removed by etching for frequency control in the final process. For example, the thickness of the passivation layer 190 may be adjusted. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as an example of the passivation layer 190.

When the passivation layer 190 is stacked, tensile stress may be applied to the passivation layer 190. The tensile stress applied to the passivation layer 190 may be 0 to 500 MPa. When the tensile stress is applied, the lattice constant of the passivation layer may be greater in an in-plane direction, and may be less in an out-of-plane direction, than those in a bulk state. For example, in the example in which the passivation layer is aluminum nitride, a ratio of lattice constants may be less than 1.58. Since tensile stress may be applied to the passivation layer 190, occurrence of voids in the first electrode 150 and the second electrode 170 may be prevented. For example, migration of the materials (particles) constituting the first electrode 150 and the second electrode 170 may be prevented, and occurrence of surface defects may be prevented.

Meanwhile, as illustrated in FIG. 6, when compressive stresses of 1600 to −400 MPa are applied such that a ratio (c/a) of lattice constants is greater than 1.5, the number of void occurrences the first electrode 150 and the second electrode 170 may increase sharply. When tensile stress is applied such that a ratio (c/a) of lattice constants is less than 1.5, occurrence of voids in the first electrode 150 and the second electrode 170 may be prevented.

As described above, when the passivation layer 190 is stacked, tensile stress may be applied to the passivation layer 190, and the in-plane lattice constant of the passivation layer 190 may be greater than a value in a bulk state. For example, in the example that the passivation layer is aluminum nitride, or aluminum nitride containing a doping element, and the tensile stress is applied, the in-plane lattice constant may be greater, the out-of-plane lattice constant may be less, and a ratio (c/a) of lattice constants may be less than 1.58.

The metal pad 195 may be formed on a portion of the first electrode 150 and the second electrode 170 in which the passivation layer 190 is not formed. As an example, the metal pad 195 may be formed of a material such as gold (Au), a gold-tin (Au—Sn) alloy, copper (Cu), a copper-tin (Cu—Sn) alloy, aluminum (Al), an aluminum alloy, and the like. For example, the aluminum alloy may be an aluminum-germanium (Al—Ge) alloy.

As described above, when the piezoelectric layer 160 and the passivation layer 190 are formed, migration of the materials (particles) constituting the first electrode 150 and the second electrode 170 may be prevented by applying tensile stress to the piezoelectric layer 160 and the passivation layer 190.

Referring to the above in detail, in the example in which the first and second electrodes 150 and 170 are formed of an aluminum material, the mechanical properties may be deteriorated, and crystal orientation of the piezoelectric layer and performance deterioration of resonator due to occurrence of hillocks by electro migration or mechanical deformation may be caused.

The first and second electrodes 150 and 170 may be formed of an alloy material made by containing scandium (Sc) in aluminum (Al) to prevent the deterioration. Even in the example that the first and second electrodes 150 and 170 are formed of an aluminum alloy material containing scandium (Sc), the mechanical properties may be improved, but in the example that the piezoelectric layer 160 is formed on the first electrode 150 and the second electrode 170, and the passivation layer 190 are stacked, occurrence of defects due to migration of the materials (particles) constituting the first and second electrodes 150 and 170 may be not solved.

As described above, when the piezoelectric layer 160 and the passivation layer 190 are formed, migration of the materials (particles) constituting the first electrode 150 and the second electrode 170 may be prevented by applying tensile stress to the piezoelectric layer 160 and the passivation layer 190.

In addition, since the first electrode 150 and the second electrode 170 are formed of an aluminum alloy material containing scandium (Sc), the electrical loss may be improved.

Furthermore, since the mechanical strength may be improved, deposition of the piezoelectric layer 160 may be more stably performed in the sputtering process to improve the crystal orientation, and the chemical resistance may be improved to secure the manufacturing stability.

Referring to the above in further detail, when surface defects are observed after depositing pure aluminum (Al) and an aluminum alloy (AlSc) containing scandium (Sc) on a seed layer of an aluminum nitride (AlN) material having a thickness of 500 Å to be a thickness of 1500 Å, a large number of defects due to hillocks and grain boundary grooves were observed in the example of pure aluminum (Al), while defects due to hillock and grain boundary grooves were remarkably reduced in the example of aluminum alloy (AlSc) containing scandium (Sc).

Figure 7:
FIG. 7 is a photograph of an example depicting surface defects of pure aluminum.
Figure 8:
FIG. 8 is a photograph of an example depicting surface defects of a scandium-containing aluminum alloy (0.625 at %).
Figure 9:
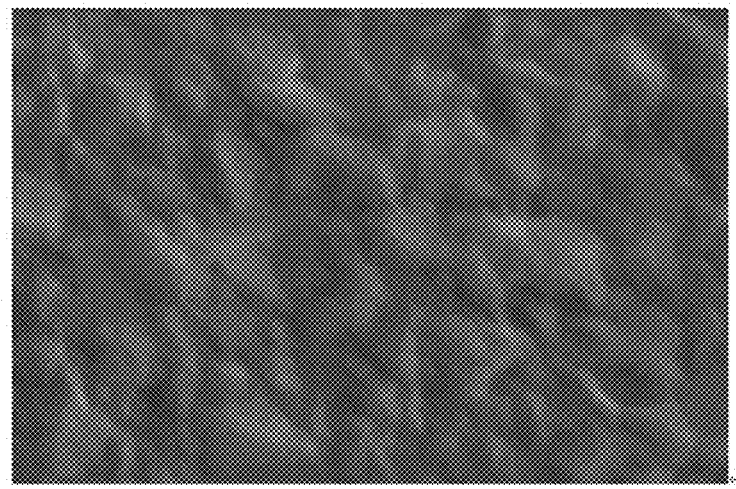
FIG. 9 is a photograph of an example depicting surface defects of a scandium-containing aluminum alloy (6.25 at %).

For example, as illustrated in FIGS. 7 to 9, groove surface defects were observed in the example of pure aluminum (Al), and no surface defect was observed in the example of aluminum alloy (AlSc, 0.625 at %) containing scandium (Sc). Also, it can be seen that in the example in which the content of scandium (Sc) is relatively excessive that the surface roughness increases.

Figure 10:
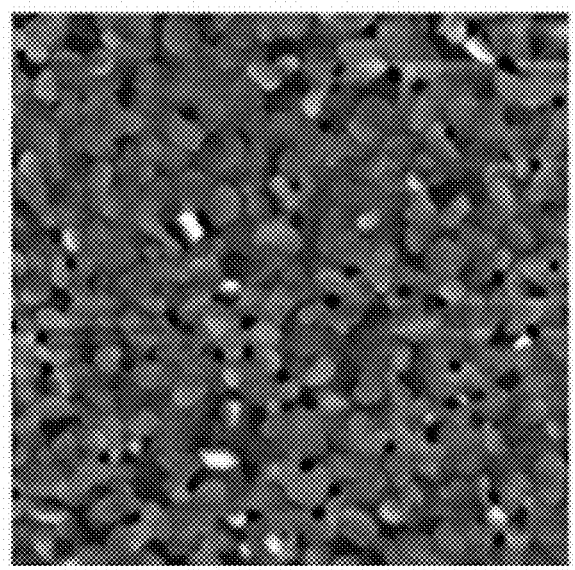
FIG. 10 is a photograph of an example illustrating a surface roughness of pure aluminum by an atomic force microscope.
Figure 11:
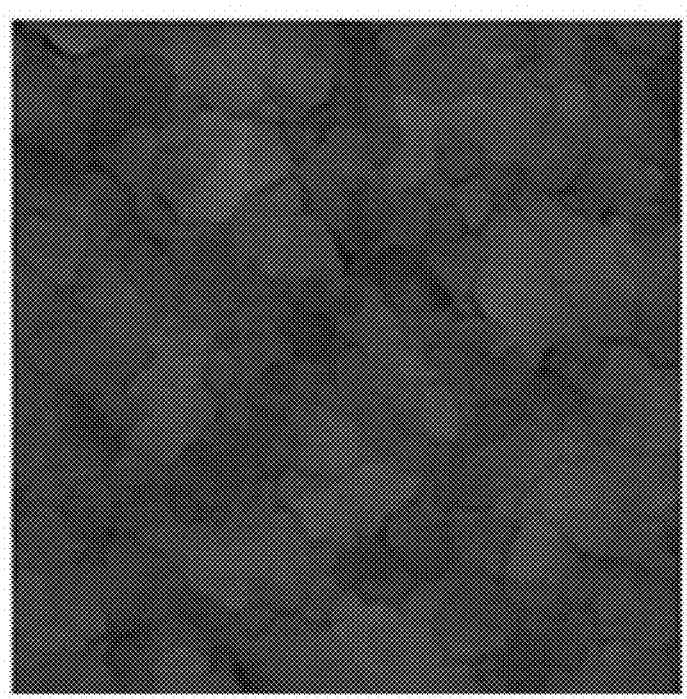
FIG. 11 is a photograph of an example illustrating a surface roughness of a scandium-containing aluminum alloy (0.625 at %) by an atomic force microscope.
Figure 12:
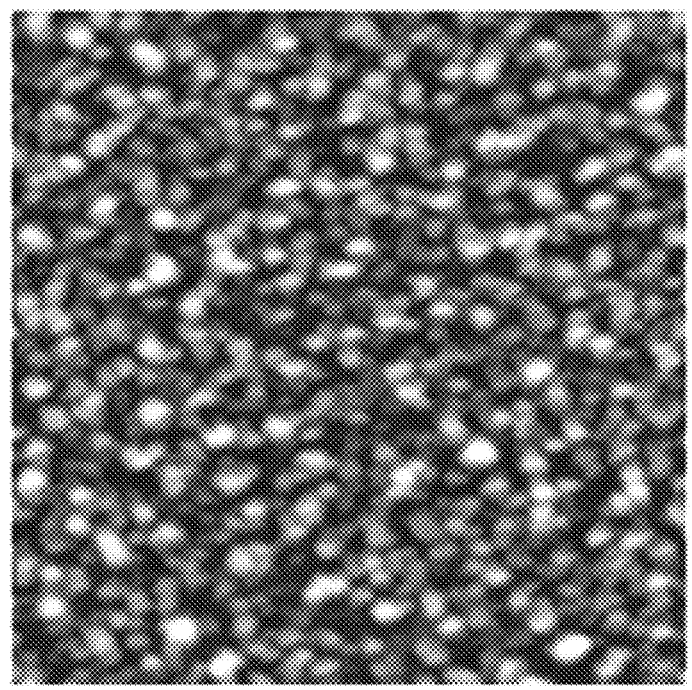
FIG. 12 is a photograph of an example illustrating a surface roughness of a scandium-containing aluminum alloy (6.25 at %) by an atomic force microscope.
Figure 13:
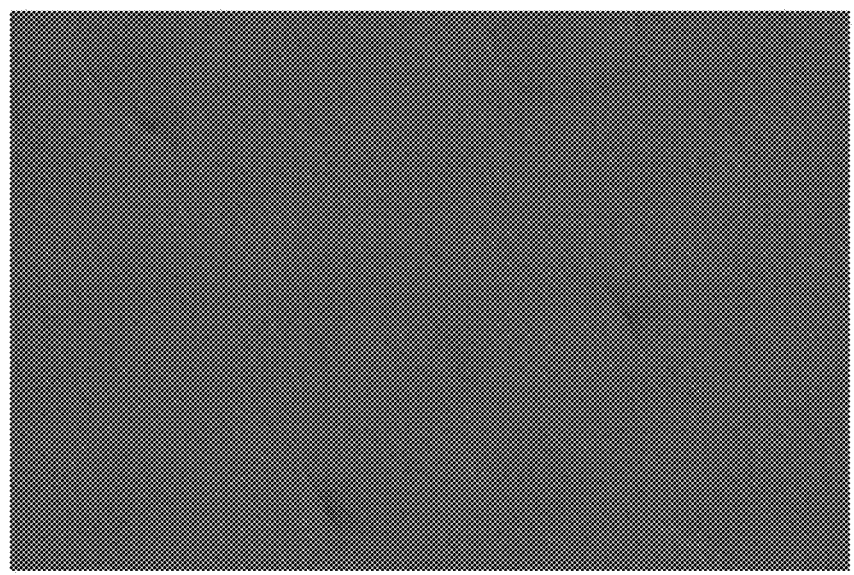
FIG. 13 is a photograph of an example depicting surface defects of a piezoelectric layer formed on pure aluminum.

Referring to the above in detail, when surface roughness of samples obtained by depositing pure aluminum (Al), an aluminum alloy (AlSc) containing 0.625 at % of scandium (Sc), and an aluminum alloy (AlSc) containing 6.25 at % of scandium (Sc) are observed using an atomic force microscope (AFM), as illustrated in FIGS. 10 to 12, a surface roughness (Ra) of the pure aluminum (Al) was 3.74 nm based on the scan size (10 um×10 um), a surface roughness (Ra) of the aluminum alloy (AlSc) containing 0.625 at % of scandium (Sc) is 1.70 nm based on the scan size (10 um×10 um), respectively. Further, in the example of an aluminum alloy (AlSc) containing 6.25 at % of scandium (Sc), the surface roughness (Ra) increased to 10.27 nm based on the scan size (10 um×10 um).

Meanwhile, pure aluminum (Al) and an aluminum alloy (AlSc) containing scandium (Sc) may have an FCC crystal structure, and may have 8% of lattice mismatch with an aluminum nitride (AlN) HCP crystal structure (0002) crystal plane, which is the piezoelectric layer 160, when oriented on a (111) crystal plane, wherein this lattice mismatch may be improved, comparing to 14% of lattice mismatch in the example of which the first electrode 150 is formed of molybdenum (Mo) material.

In the example of pure aluminum (Al), in the example that the surface roughness is increased due to surface defects, or the like, the crystal orientation of the piezoelectric layer 160 may deteriorate.

When pure aluminum (Al), an aluminum alloy (AlSc) containing scandium (Sc), and molybdenum (Mo) were deposited on a seed layer of an aluminum nitride (AlN) material having a thickness of 500 Å to be a thickness of 1,500 Å, an aluminum nitride (AlN), which is the piezoelectric layer 160, was deposited to be a thickness of 5,000 Å, and XRD rocking curve was measured to compare crystal orientations of thin films, the results were shown in the following Table 2.

TABLE 2

| FWHM(degree) | Molybdenum (Mo) | Pure Aluminum (Al) | Sc-containing Aluminum Alloy (AlSc, 6.25at %) | Sc-containing Aluminum Alloy (AlSc, 0.625at %) |
|---|---|---|---|---|
| 1$^{st}$ Electrode Crystal Orientation (1500 Å) | 2.77° (110) | 1.31° (111) | 1.13° (111) | 0.49° (111) |
| Piezoelectric Layer Crystal Orientation (5000 Å) | 1.95° (0002) | 1.73° (0002) | 2.19° (0002) | 0.78° (0002) |

Figure 14:
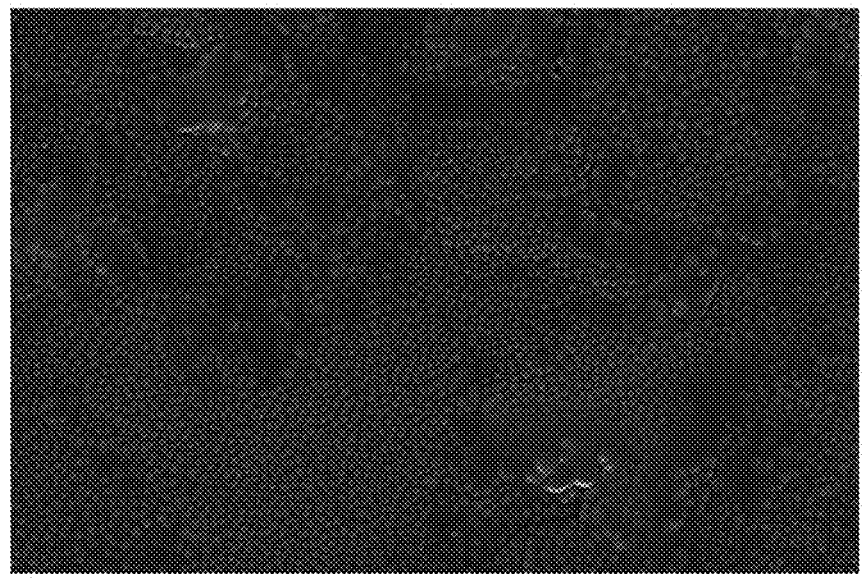
FIG. 14 is a photograph of an example depicting surface defects of a piezoelectric layer formed on a scandium-containing aluminum alloy (6.25 at %).
Figure 15:
FIG. 15 is a photograph of an example depicting surface defects of a piezoelectric layer formed on a scandium-containing aluminum alloy (0.625 at %).

For example, when aluminum nitride (AlN) was deposited on molybdenum (Mo), the crystal orientation of aluminum nitride (AlN) was 1.95°, and when aluminum nitride (AlN) was deposited on pure aluminum (Al), the crystal orientation was 1.73°, rather due to the surface defects of pure aluminum (Al). For example, the crystal orientation of the piezoelectric layer may be improved as compared with the example in which molybdenum (Mo) was applied, but surface defects of grooves observed on the surface of pure aluminum (Al) may be transferred as they are, even in the example that the aluminum nitride (AlN) was deposited. Further, in the example of an aluminum alloy (AlSc) containing 6.25 at % of scandium (Sc), as illustrated in FIG. 14 due to an increase in surface roughness, the crystal orientation was poor to be 2.19° (See Table 2). In the example of an aluminum alloy (AlSc) containing 0.625 at % of scandium (Sc), as illustrated in FIG. 15, the crystal orientation in the example that the aluminum nitride (AlN) is deposited is the best to be 0.78° (See Table 2), comparing to those of pure aluminum (Al). For example, the piezoelectric layer 160 may be deposited more stably during the sputtering process to improve the crystal orientation, and the chemical resistance may be improved to secure the manufacturing stability.

Hereinafter, a method of manufacturing a bulk-acoustic wave resonator according to an example of the present disclosure will be described with reference to the drawings.

Figure 16:
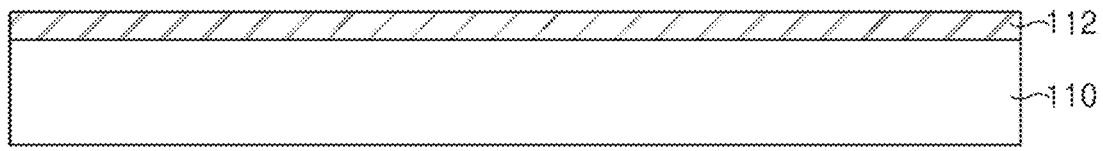
FIGS. 16 to 25 are flow charts of examples depicting a method of manufacturing a bulk-acoustic wave resonator.

First, as illustrated in FIG. 16, a substrate 110 may be prepared. An insulation layer 112 may be formed on the substrate 110, and the substrate 110 may be electrically isolated from configurations formed in a position above the substrate. The insulation layer 112 may also function to prevent the substrate 110 from being etched by etching gas, when a cavity C is formed during the manufacturing process.

Figure 17:
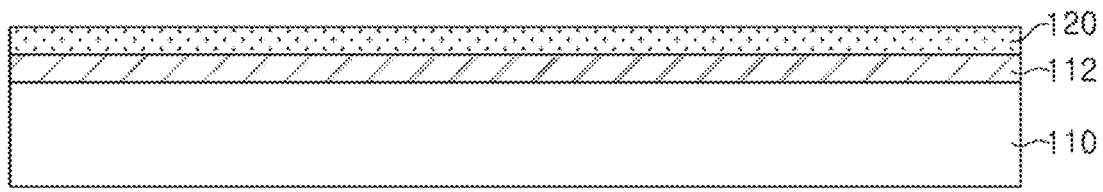

Thereafter, as illustrated in FIG. 17, a sacrificial layer 120 may be formed on the insulation layer 112 of the substrate 110. Meanwhile, a portion of the sacrificial layer 120 may be then removed to form the cavity C.

Figure 18:
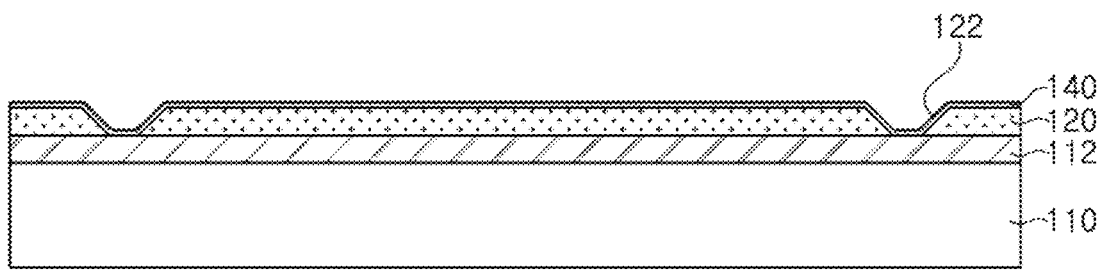

Meanwhile, as illustrated in FIG. 18, the sacrificial layer 120 may be formed with an installation groove 122, and then a membrane layer 140 may be formed. The membrane layer 140 may form a cavity C with the substrate 110, when a portion of the sacrificial layer 120 is removed.

Figure 19:
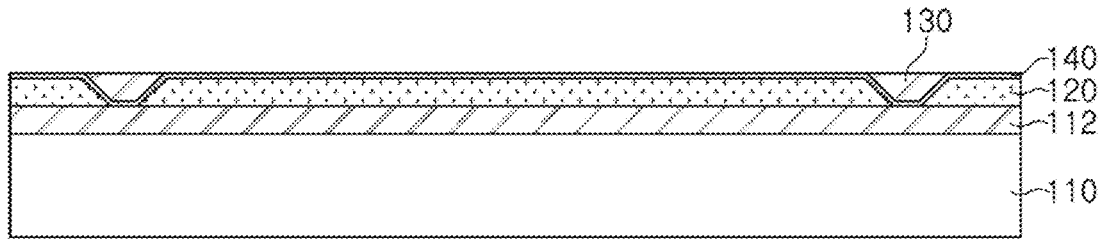

Further, as illustrated in FIG. 19, an etching prevention portion 130 may be inserted into the installation groove 122 of the sacrificial layer 120. The etching prevention portion 130 may be disposed along a boundary of the cavity C to be subsequently formed. Then, only a portion of the sacrificial layer 120 may be removed by the etching prevention portion 130, and the remaining portion may remain.

Figure 20:
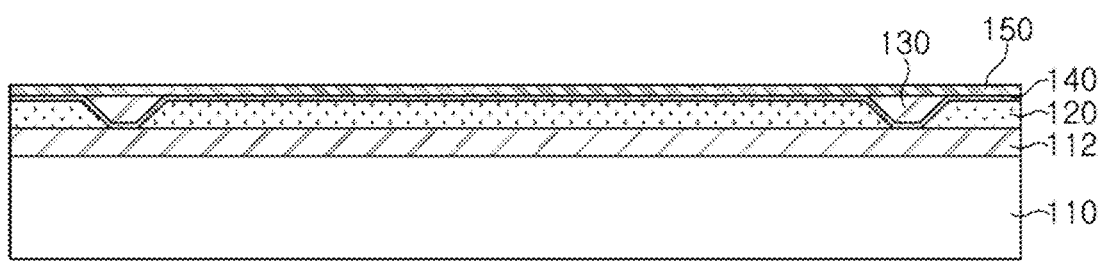

Thereafter, as illustrated in FIG. 20, a first electrode 150 may be formed on the membrane layer 140. The first electrode 150 may be formed on the membrane layer 140 formed in a flat shape, and may thus be formed in a flat shape. The first electrode 150 may be formed of an aluminum alloy material containing scandium (Sc) as an example. As described above, since the first electrode 150 may be formed of an aluminum alloy material containing scandium (Sc), mechanical strength may be increased and high power reactive sputtering may also be achieved. Under such deposition conditions, an increase of a surface roughness of the first electrode 150 may be prevented, and high orientation growth of the piezoelectric layer 160 may be induced.

Figure 21:
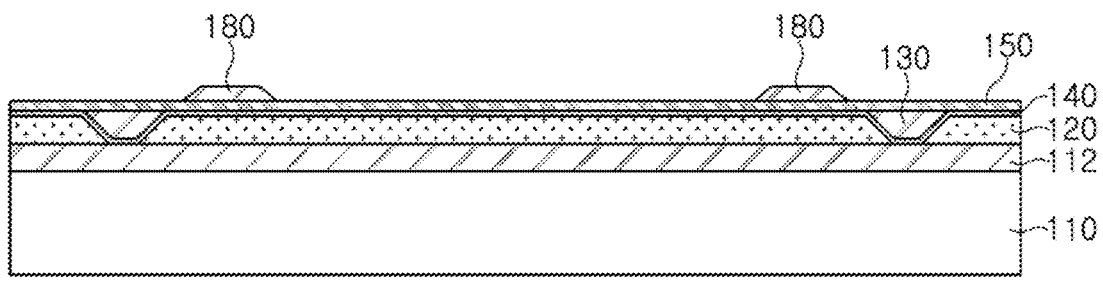

Thereafter, as illustrated in FIG. 21, an insertion layer 180 may be formed on the first electrode 150. The insertion layer 180 may be disposed around the flat portion S, to be described later, to support a bent portion 164 of the piezoelectric layer 160. The bent portion 164 of the piezoelectric layer 160 may be divided into an inclined portion 164a and an extended portion 164b along a shape of the insertion layer 180.

Figure 22:
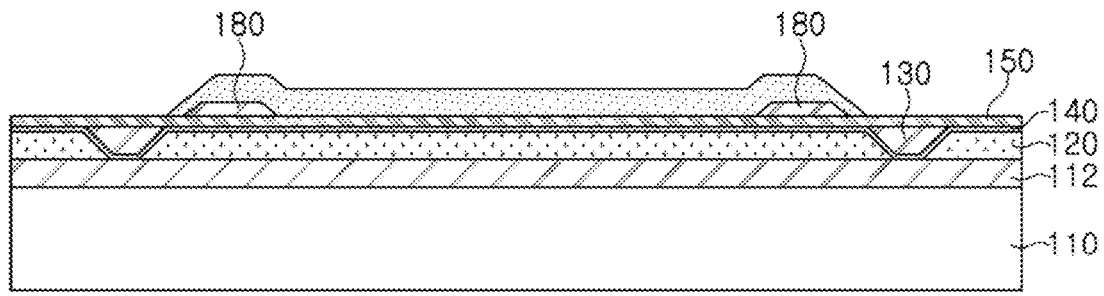

Thereafter, as illustrated in FIG. 22, a piezoelectric layer 160 may be formed on the first electrode 150. The piezoelectric layer 160 may be formed of one of aluminum nitride (AlN), zinc oxide (ZnO), and lead zirconium titanium oxide (PZT; PbZrTiO). In particular, in the example that the piezoelectric layer 160 is formed of aluminum nitride (AlN), the piezoelectric layer 150 may further include a rare earth metal. As an example, the rare earth metal may include any one or any combination of any two or more of scandium (Sc), erbium (Er), yttrium (Y), and lanthanum (La). In addition, as an example, the transition metal may include any one or any combination of any two or more of titanium (Ti), zirconium (Zr), hafnium (Hf), tantalum (Ta), and niobium (Nb). Magnesium (Mg), which is a divalent metal, may also be included.

The piezoelectric layer 160 may include a piezoelectric portion 162 disposed on a flat portion S, and a bent portion 164 disposed on an extension portion E.

The piezoelectric portion 162 may be a portion directly stacked on the upper surface of the first electrode 150. Therefore, the piezoelectric portion 162 may be disposed between the first electrode 150 and the second electrode 170, and may be formed in a flat shape, together with the first electrode 150 and the second electrode 170.

The bent portion 164 may be defined as a portion extending outward from the piezoelectric portion 162, and may be located in the extension portion E.

The bent portion 164 may be disposed on the insertion layer 180 to be described later, and may be formed in a shape raising along a shape of the insertion layer 180. The piezoelectric layer 160 may be bent at the boundary between the piezoelectric portion 162 and the bent portion 164, and the bent portion 164 may be raised corresponding to a thickness and a shape of the insertion layer 180.

The bent portion 164 may be divided into an inclined portion 164a and an extended portion 164b.

The inclined portion 164a refers to a portion formed to be inclined along an inclined surface L of the insertion layer 180 to be described later. The extended portion 164b refers to a portion extending outward from the inclined portion 164a.

The inclined portion 164a may be formed parallel to the inclined surface L of the insertion layer 180, and an inclination angle of the inclined portion 164a may be formed to be equal to an inclination angle ($\theta$ in FIG. 3) of the inclined surface L.

Meanwhile, when the piezoelectric layer 160 is stacked, tensile stress may be applied to the piezoelectric layer 160. The tensile stress applied to the piezoelectric layer 160 may be 0 to 500 MPa. In this example, in the example that the piezoelectric layer 160 may be formed of aluminum nitride, or aluminum nitride containing a doping element, c/a, which is the ratio of an in-plane lattice constant "a" to an out-of-plane lattice constant "c," may be less than 1.58. As described above, since tensile stress of 0 to 500 MPa may be applied to the piezoelectric layer 160, occurrence of voids in the first electrode 150 may be prevented. For example, migration of the materials (particles) constituting the first electrode 150 may be prevented, and occurrence of surface defects may be prevented.

Meanwhile, as illustrated in FIG. 6, when a ratio (c/a) of lattice constants is approximately greater than 1.58, the number of void occurrence in the first electrode 150 may increase sharply. When a ratio (c/a) of lattice constants is less than 1.58, tensile stress may be applied to prevent void occurrence in the first electrode 150.

As described above, when the piezoelectric layer 160 is stacked, tensile stress may be applied to the piezoelectric layer 160. Therefore, a ratio (c/a) of lattice constants of the piezoelectric layer 160 may be less than 1.58.

Figure 23:
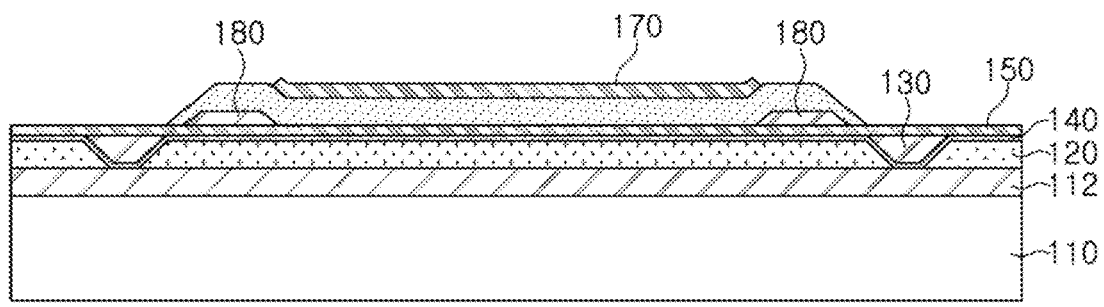

Thereafter, referring to FIG. 23, a second electrode 170 may be formed to cover at least a portion of the piezoelectric layer 160 disposed in a position above the cavity C. The second electrode 170 may be formed of an aluminum alloy material containing scandium (Sc), in a similar manner to the first electrode 150.

Figure 24:
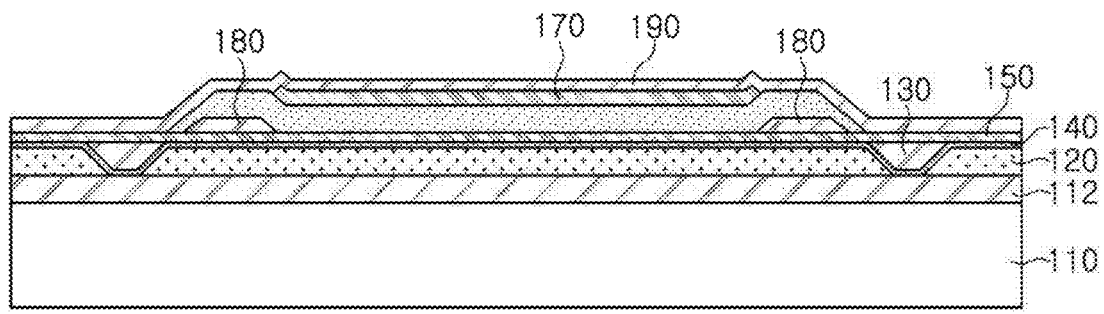

Thereafter, referring to FIG. 24, a passivation layer 190 may be formed to cover the first electrode 150 and the second electrode 170. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as an example of the passivation layer 190.

Meanwhile, when the passivation layer 190 is stacked, tensile stress may be applied to the passivation layer 190. The tensile stress applied to the passivation layer 190 may be 0 to 500 MPa. In this example, the in-plane lattice constant of the passivation layer 190 may be greater than the bulk value. For example, in the example in which the passivation layer is aluminum nitride, or aluminum nitride containing a doping element, and the tensile stress is applied, the in-plane lattice constant may be greater, the out-of-plane lattice constant may be less, and a ratio (c/a) of lattice constants may be less than 1.58. As above, since tensile stress may be applied to the passivation layer 190, occurrence of voids in the first electrode 150 and the second electrode 170 may be prevented. For example, migration of the materials (particles) constituting the first electrode 150 and the second electrode 170 may be prevented, and occurrence of surface defects may be prevented.

As described above, when the passivation layer 190 is stacked, tensile stress may be applied to the passivation layer 190. Therefore, the in-plane lattice constant of the passivation layer 190 may be greater than the bulk value. For example, in the example that the passivation layer 190 is aluminum nitride, or aluminum nitride containing a doping element, and the tensile stress is applied, the in-plane lattice constant may be greater, the out-of-plane lattice constant may be less, and a ratio (c/a) of lattice constants may be less than 1.58.

Figure 25:
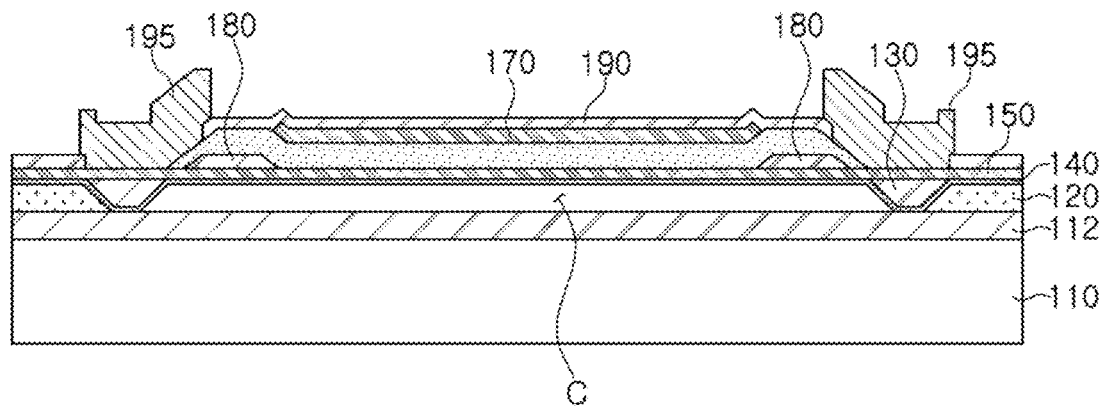

Thereafter, as illustrated in FIG. 25, a metal pad 195 may be formed. The metal pad 195 may be formed on a portion of the first electrode 150 and the second electrode 170 in which the passivation layer 190 is not formed. As an example, the metal pad 195 may be formed of a material such as gold (Au), a gold-tin (Au—Sn) alloy, copper (Cu), a copper-tin (Cu—Sn) alloy, aluminum (Al), an aluminum alloy, and the like. For example, the aluminum alloy may be an aluminum-germanium (Al—Ge) alloy.

As described above, when the piezoelectric layer 160 and the passivation layer 190 are formed, migration of the materials (particles) constituting the first electrode 150 and the second electrode 170 may be prevented by applying a tensile stress of 0 to 500 MPa to the piezoelectric layer 160 and the passivation layer 190.

Hereinafter, a modified example of the bulk-acoustic wave resonator according to the present disclosure will be described with reference to the drawings. However, the same elements as those described above are shown in the drawings by using the reference numerals used above, and a detailed description thereof will be omitted.

Figure 26:
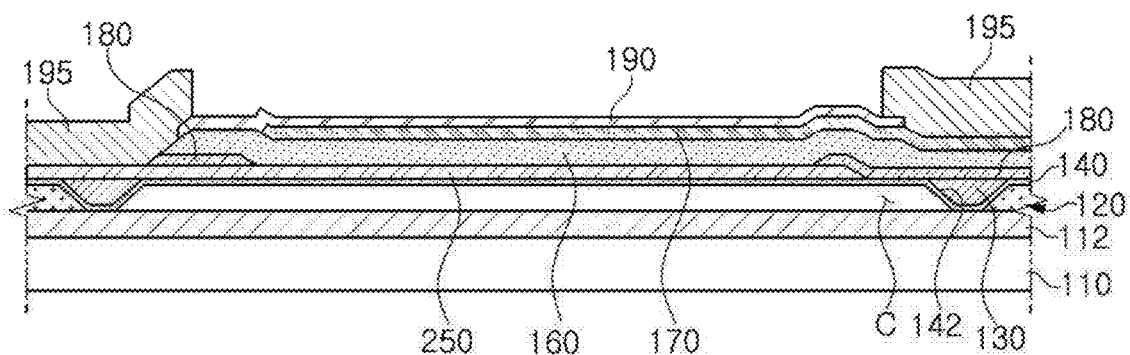
FIG. 26 is a schematic plan view illustrating an example of a bulk-acoustic wave resonator.

FIG. 26 is a schematic plan view illustrating an example of a bulk-acoustic wave resonator.

Referring to FIG. 26, a bulk-acoustic wave resonator 200 of the present disclosure may include a substrate 110, a sacrificial layer 120, an etching prevention portion 130, a membrane layer 140, a first electrode 250, a piezoelectric layer 160, a second electrode 170, an insertion layer 180, a passivation layer 190, and a metal pad 195, as one example.

The first electrode 250 may be formed on the membrane layer 140, and a portion thereof may be disposed on an upper portion of the cavity C. In addition, the first electrode 250 may be used as either an input electrode or an output electrode for inputting and outputting an electrical signal such as a radio frequency (RF) signal, and the like.

The first electrode 250 may be formed using a conductive material such as molybdenum (Mo), or an alloy thereof. The present disclosure is not limited thereto, and the first electrode 250 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

The second electrode 170 may be formed to cover at least a portion of the piezoelectric layer 160 disposed in a position above the cavity C. The second electrode 170 may be used as either an input electrode or an output electrode for inputting and outputting an electrical signal such as a radio frequency (RF) signal, and the like. For example, in the example that the first electrode 250 is used as an input electrode, the second electrode 170 may be used as an output electrode, and in the example that the first electrode 250 is used as an output electrode, the second electrode 170 may be used as an input electrode.

The second electrode 170 may be formed of an aluminum alloy material containing scandium (Sc).

The passivation layer 190 may be formed in an area except for a portion of the first electrode 250 and the second electrode 170. The passivation layer 190 may prevent damage of the second electrode 170 and the first electrode 250 during the manufacturing process.

Furthermore, the passivation layer 190 may be partially removed by etching for frequency control in the final process. For example, the thickness of the passivation layer 190 may be adjusted. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as an example of the passivation layer 190.

Meanwhile, when the passivation layer 190 is stacked, tensile stress may be applied to the passivation layer 190. The tensile stress applied to the passivation layer 190 may be 0 to 500 MPa. In this example, the in-plane lattice constant of the passivation layer 190 may be greater than the bulk value. For example, in the example in which the passivation layer is aluminum nitride, or aluminum nitride containing a doping element, and the tensile stress is applied, the in-plane lattice constant may be greater, the out-of-plane lattice constant may be less, and a ratio (c/a) of lattice constants may be less than 1.58. As above, since tensile stress may be applied to the passivation layer 190, occurrence of voids in the second electrode 170 may be prevented. For example, migration of the materials (particles) constituting the second electrode 170 may be prevented, and occurrence of surface defects may be prevented.

As described above, when the passivation layer 190 disposed on the second electrode 170 is stacked, tensile stress may be applied to the passivation layer 190. Therefore, occurrence of voids in the second electrode 170 may be prevented. For example, migration of the materials (particles) constituting the second electrode 170 may be prevented, and occurrence of surface defects may be prevented.

Figure 27:
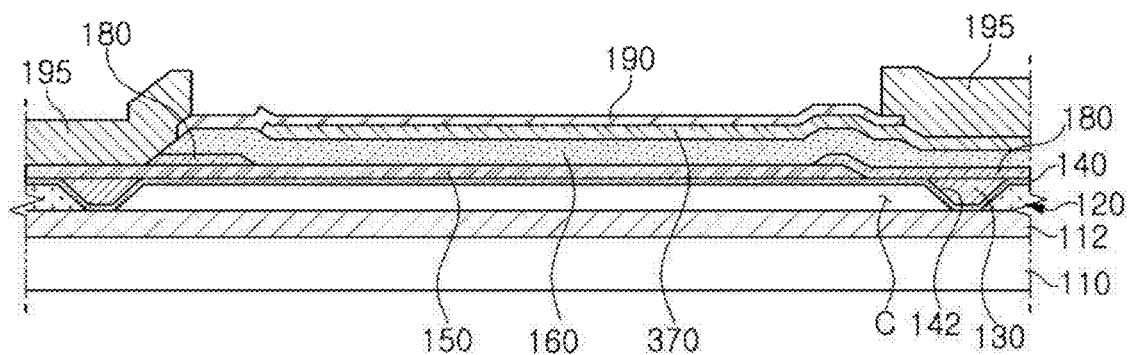
FIG. 27 is a schematic plan view illustrating an example of a bulk-acoustic wave resonator.

FIG. 27 is a schematic plan view illustrating an example of a bulk-acoustic wave resonator.

Referring to FIG. 27, a bulk-acoustic wave resonator 300 of the present disclosure may include a substrate 110, a sacrificial layer 120, an etching prevention portion 130, a membrane layer 140, a first electrode 150, a piezoelectric layer 160, a second electrode 370, an insertion layer 180, a passivation layer 190, and a metal pad 195, as one example.

The second electrode 370 may be formed to cover at least the piezoelectric layer 160 disposed in a position above the cavity C. The second electrode 370 may be used as either an input electrode or an output electrode for inputting and outputting an electrical signal such as a radio frequency (RF) signal, and the like. For example, in the example that the first electrode 150 is used as an input electrode, the second electrode 370 may be used as an output electrode, and in the example that the first electrode 150 is used as an output electrode, the second electrode 370 may be used as an input electrode.

The second electrode 370 may be formed using a conductive material such as molybdenum (Mo), or an alloy thereof. The present disclosure is not limited thereto, and the second electrode 370 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

Meanwhile, when the piezoelectric layer 160 is stacked, tensile stress may be applied to the piezoelectric layer 160. The tensile stress applied to the piezoelectric layer 160 may be 0 to 500 MPa. When the tensile stress is applied, and the piezoelectric layer is formed of aluminum nitride, or aluminum nitride containing a doping element, a ratio (c/a) of lattice constants may be less than 1.58. As described above, since tensile stress may be applied such that a ratio (c/a) of lattice constants of the piezoelectric layer 160 becomes smaller than 1.58, occurrence of voids in the first electrode 150 may be prevented. For example, migration of the materials (particles) constituting the first electrode 150 may be prevented, and occurrence of surface defects may be prevented.

Figure 28:
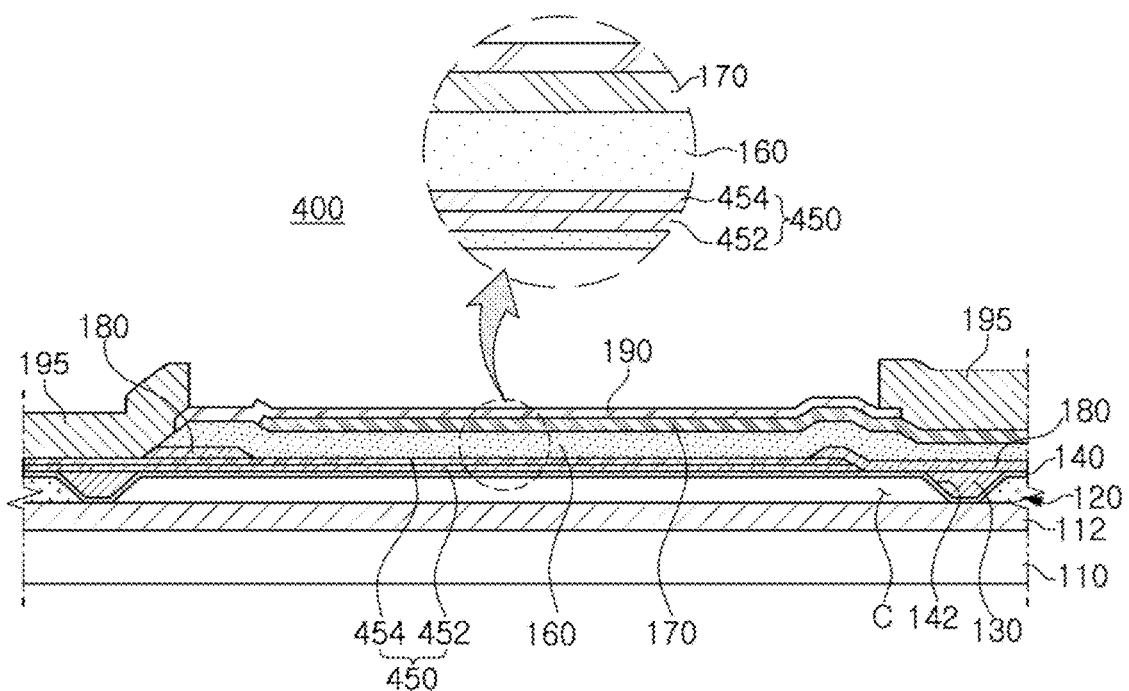
FIG. 28 is a schematic plan view illustrating an example of a bulk-acoustic wave resonator.

FIG. 28 is a schematic plan view illustrating an example of a bulk-acoustic wave resonator.

Referring to FIG. 28, a bulk-acoustic wave resonator 400 of the present disclosure may include a substrate 110, a sacrificial layer 120, an etching prevention portion 130, a membrane layer 140, a first electrode 450, a piezoelectric layer 160, a second electrode 170, an insertion layer 180, a passivation layer 190, and a metal pad 195, as one example.

The first electrode 450 may be formed on the membrane layer 140, and a portion thereof may be disposed on an upper portion of the cavity C. In addition, the first electrode 450 may be used as either an input electrode or an output electrode for inputting and outputting an electrical signal such as a radio frequency (RF) signal, and the like.

As one example, the first electrode 450 may include a 1-1 electrode layer 452, and a 1-2 electrode layer 454 formed on the 1-1 electrode layer 452 and formed of an aluminum alloy material containing scandium (Sc).

The 1-1 electrode layer 452 may be formed using a conductive material such as molybdenum (Mo), or an alloy thereof. The present disclosure is not limited thereto, and the 1-1 electrode layer 452 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

When the piezoelectric layer 160 and the passivation layer 190 are formed, tensile stress may be applied to the piezoelectric layer 160 and the passivation layer 190 to prevent occurrence of defects due to migration of the materials (particles) constituting the 1-2 electrode layer 454 and the second electrode 170.

Figure 29:
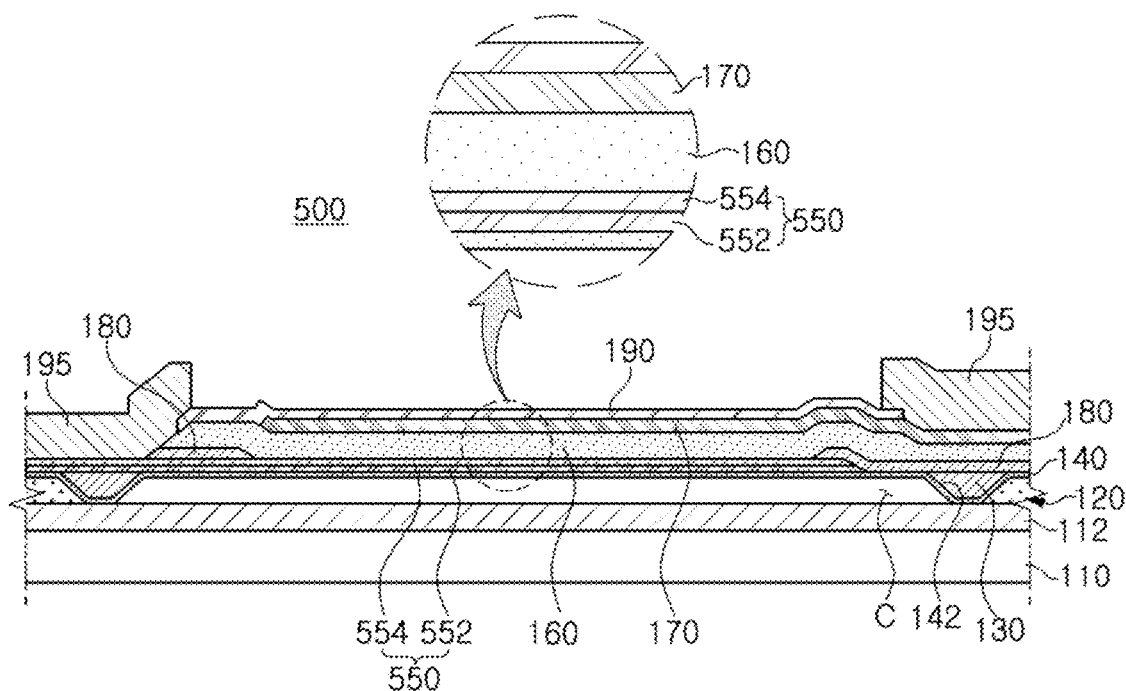
FIG. 29 is a schematic plan view illustrating an example of a bulk-acoustic wave resonator.

FIG. 29 is a schematic plan view illustrating an example of a bulk-acoustic wave resonator.

Referring to FIG. 29, a bulk-acoustic wave resonator 500 of the present disclosure may include a substrate 110, a sacrificial layer 120, an etching prevention portion 130, a membrane layer 140, a first electrode 550, a piezoelectric layer 160, a second electrode 170, an insertion layer 180, a passivation layer 190, and a metal pad 195, as one example.

The first electrode 550 may be formed on the membrane layer 140, and a portion thereof may be disposed on an upper portion of the cavity C. In addition, the first electrode 550 may be used as either an input electrode or an output electrode for inputting and outputting an electrical signal such as a radio frequency (RF) signal, and the like.

As one example, the first electrode 550 may include a 1-1 electrode layer 552 formed of an aluminum alloy material containing scandium (Sc), and a 1-2 electrode layer 554 formed on the 1-1 electrode layer 552.

The 1-2 electrode layer 554 may be formed using a conductive material such as molybdenum (Mo), or an alloy thereof. The present disclosure is not limited thereto, and the 1-2 electrode layer 554 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

When the passivation layer 190 is formed, tensile stress may be applied to the passivation layer 190 to prevent occurrence of defects due to migration of the materials (particles) constituting the second electrode 170. In this example, the in-plane lattice constant of the passivation layer 190 may be greater than a value in a bulk state. For example, in the example that the passivation layer is aluminum nitride, or aluminum nitride containing a doping element, and the tensile stress is applied, the in-plane lattice constant may be greater, the out-of-plane lattice constant may be less, and a ratio (c/a) of lattice constants may be less than 1.58.

Figure 30:
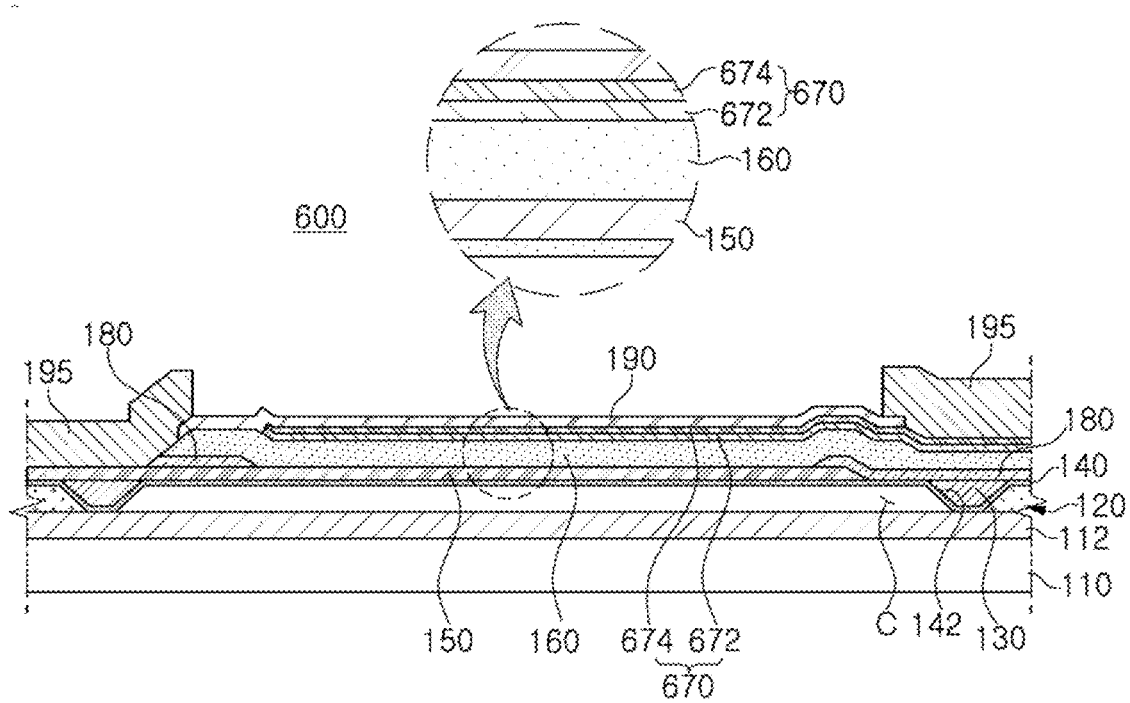
FIG. 30 is a schematic plan view illustrating an example of a bulk-acoustic wave resonator.

FIG. 30 is a schematic plan view illustrating an example of a bulk-acoustic wave resonator.

Referring to FIG. 30, a bulk-acoustic wave resonator 600 of the present disclosure may include a substrate 110, a sacrificial layer 120, an etching prevention portion 130, a membrane layer 140, a first electrode 150, a piezoelectric layer 160, a second electrode 670, an insertion layer 180, a passivation layer 190, and a metal pad 195, as one example.

The second electrode 670 may be formed to cover at least a portion of the piezoelectric layer 160 disposed in a position above the cavity C. The second electrode 670 may be used as either an input electrode or an output electrode for inputting and outputting an electrical signal such as a radio frequency (RF) signal, and the like. For example, in the example that the first electrode 150 is used as an input electrode, the second electrode 670 may be used as an output electrode, and in the example that the first electrode 150 is used as an output electrode, the second electrode 670 may be used as an input electrode.

The second electrode 670 may include a 2-1 electrode layer 672, and a 2-2 electrode layer 674 disposed on the 2-1 electrode layer 672 and formed of an aluminum alloy material containing scandium (Sc).

The 2-1 electrode layer 672 may be formed using a conductive material such as molybdenum (Mo), or an alloy thereof. The present disclosure is not limited thereto, and the 2-1 electrode layer 672 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

When the piezoelectric layer 160 and the passivation layer 190 are formed, tensile stress may be applied to the piezoelectric layer 160 and the passivation layer 190 to prevent occurrence of defects due to migration of the materials (particles) constituting the 2-2 electrode layer 674.

Figure 31:
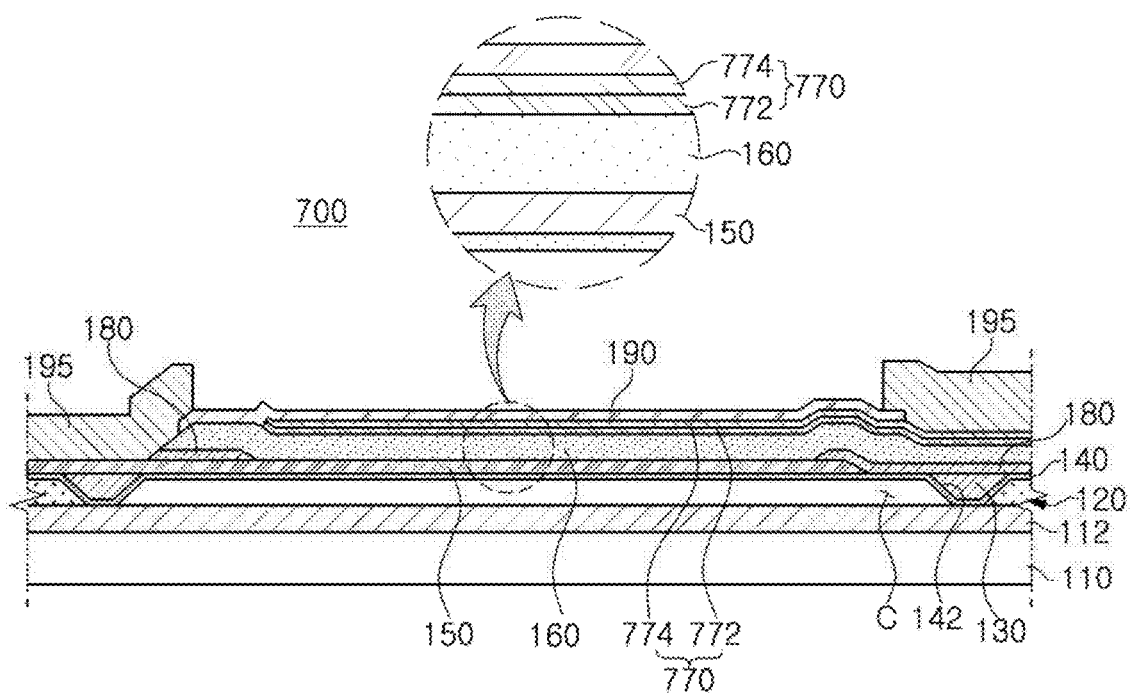
FIG. 31 is a schematic plan view illustrating an example of a bulk-acoustic wave resonator.

FIG. 31 is a schematic plan view illustrating an example of a bulk-acoustic wave resonator.

Referring to FIG. 31, a bulk-acoustic wave resonator 700 according to a seventh example of the present disclosure may include a substrate 110, a sacrificial layer 120, an etching prevention portion 130, a membrane layer 140, a first electrode 150, a piezoelectric layer 160, a second electrode 770, an insertion layer 180, a passivation layer 190, and a metal pad 195, as one example.

The second electrode 770 may be formed to cover at least a portion of the piezoelectric layer 160 disposed in a position above the cavity C. The second electrode 770 may be used as either an input electrode or an output electrode for inputting and outputting an electrical signal such as a radio frequency (RF) signal, and the like. For example, in the example that the first electrode 150 is used as an input electrode, the second electrode 770 may be used as an output electrode, and in the example that the first electrode 150 is used as an output electrode, the second electrode 770 may be used as an input electrode.

The second electrode 770 may include a 2-1 electrode layer 772 formed of an aluminum alloy material containing scandium (Sc), and a 2-2 electrode layer 774 disposed on the 2-1 electrode layer 772.

The 2-2 electrode layer 774 may be formed using a conductive material such as molybdenum (Mo), or an alloy thereof. The present disclosure is not limited thereto, and the 2-2 electrode layer 774 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

When the piezoelectric layer 160 is formed, a ratio (c/a) of lattice constants of the piezoelectric layer 160 is made to be less than 1.58, to prevent occurrence of defects due to migration of the materials (particles) constituting the first electrode 150.

Figure 32:
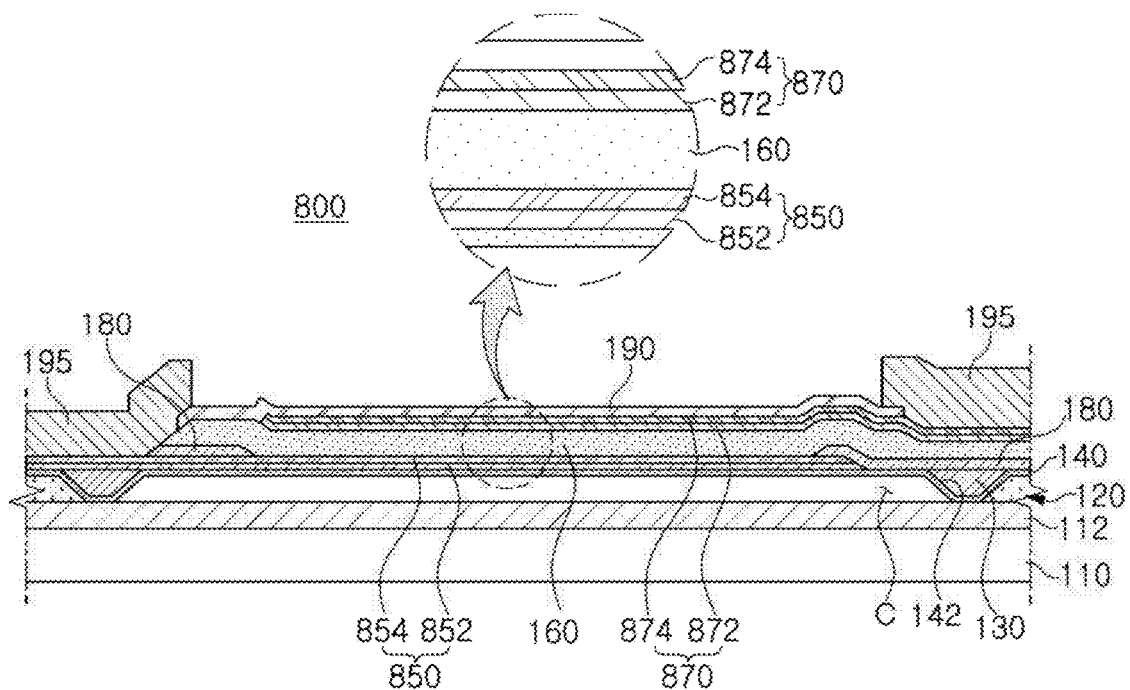
FIG. 32 is a schematic plan view illustrating an example of a bulk-acoustic wave resonator.

FIG. 32 is a schematic plan view illustrating an example of a bulk-acoustic wave resonator.

Referring to FIG. 32, a bulk-acoustic wave resonator 800 of the present disclosure may include a substrate 110, a sacrificial layer 120, an etching prevention portion 130, a membrane layer 140, a first electrode 850, a piezoelectric layer 160, a second electrode 870, an insertion layer 180, a passivation layer 190, and a metal pad 195, as one example.

The first electrode 850 may be formed on the membrane layer 140, and a portion thereof may be disposed on an upper portion of the cavity C. In addition, the first electrode 850 may be used as either an input electrode or an output electrode for inputting and outputting an electrical signal such as a radio frequency (RF) signal, and the like.

As one example, the first electrode 850 may include a 1-1 electrode layer 852, and a 1-2 electrode layer 854 formed on the 1-1 electrode layer 852 and formed of an aluminum alloy material containing scandium (Sc).

The 1-1 electrode layer 852 may be formed using a conductive material such as molybdenum (Mo), or an alloy thereof. The present disclosure is not limited thereto, and the 1-1 electrode layer 852 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

The second electrode 870 may be formed to cover at least a portion of the piezoelectric layer 160 disposed in a position above the cavity C. The second electrode 870 may be used as either an input electrode or an output electrode for inputting and outputting an electrical signal such as a radio frequency (RF) signal, and the like. For example, in the example that the first electrode 850 is used as an input electrode, the second electrode 870 may be used as an output electrode, and in the example that the first electrode 850 is used as an output electrode, the second electrode 870 may be used as an input electrode.

The second electrode 870 may include a 2-1 electrode layer 872, and a 2-2 electrode layer 874 disposed on the 2-1 electrode layer 872 and formed of an aluminum alloy material containing scandium (Sc).

The 2-1 electrode layer 872 may be formed using a conductive material such as molybdenum (Mo), or an alloy thereof. The present disclosure is not limited thereto, and the 2-1 electrode layer 872 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

When the piezoelectric layer 160 and the passivation layer 190 are formed, tensile stress may be applied to the piezoelectric layer 160 and the passivation layer 190 to prevent occurrence of defects due to migration of the materials (particles) constituting the 2-1 electrode layer 872 and the 2-2 electrode layer 874.

Figure 33:
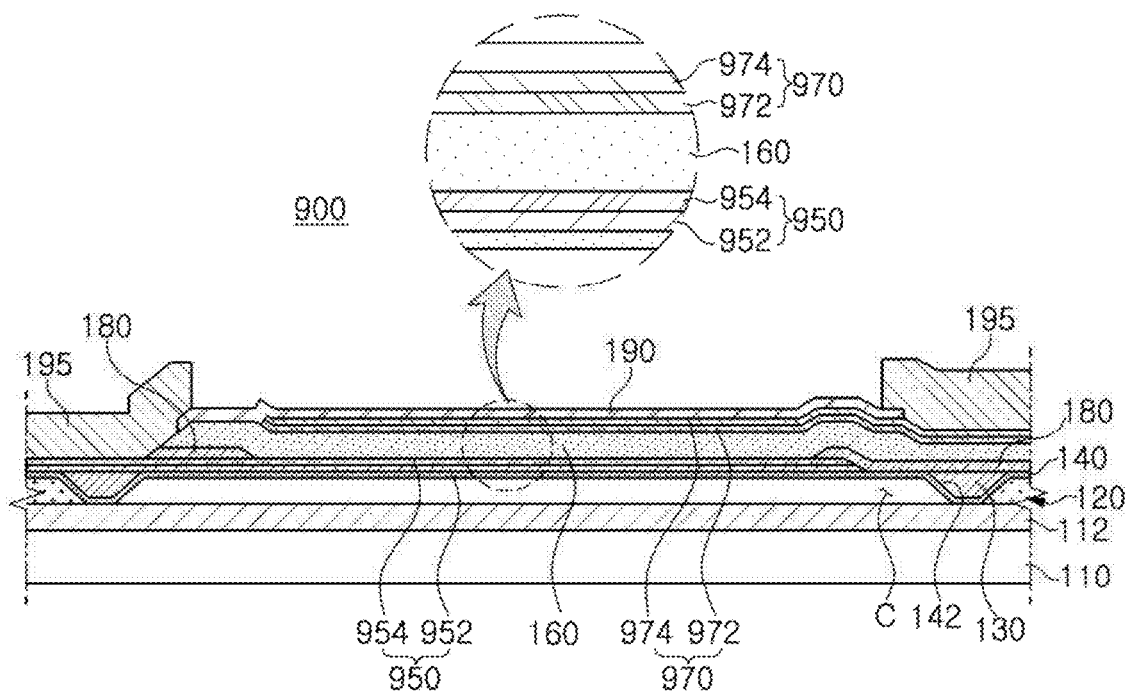
FIG. 33 is a schematic plan view illustrating an example of a bulk-acoustic wave resonator.

FIG. 33 is a schematic plan view illustrating an example of a bulk-acoustic wave resonator of the present disclosure.

Referring to FIG. 33, a bulk-acoustic wave resonator 900 of the present disclosure may include a substrate 110, a sacrificial layer 120, an etching prevention portion 130, a membrane layer 140, a first electrode 950, a piezoelectric layer 160, a second electrode 970, an insertion layer 180, a passivation layer 190, and a metal pad 195, as one example.

The first electrode 950 may be formed on the membrane layer 140, and a portion thereof may be disposed on an upper portion of the cavity C. In addition, the first electrode 950 may be used as either an input electrode or an output electrode for inputting and outputting an electrical signal such as a radio frequency (RF) signal, and the like.

As one example, the first electrode 950 may include a 1-1 electrode layer 952, and a 1-2 electrode layer 954 formed on the 1-1 electrode layer 952 and formed of an aluminum alloy material containing scandium (Sc).

The 1-1 electrode layer 952 may be formed using a conductive material such as molybdenum (Mo), or an alloy thereof. The present disclosure is not limited thereto, and the 1-1 electrode layer 952 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

The second electrode 970 may be formed to cover at least a portion of the piezoelectric layer 160 disposed in a position above the cavity C. The second electrode 970 may be used as either an input electrode or an output electrode for inputting and outputting an electrical signal such as a radio frequency (RF) signal, and the like. For example, in the example that the first electrode 950 is used as an input electrode, the second electrode 970 may be used as an output electrode, and in the example that the first electrode 950 is used as an output electrode, the second electrode 970 may be used as an input electrode.

The second electrode 970 may include a 2-1 electrode layer 972 formed of an aluminum alloy material containing scandium (Sc), and a 2-2 electrode layer 974 disposed on the 2-1 electrode layer 972.

The 2-2 electrode layer 974 may be formed using a conductive material such as molybdenum (Mo), or an alloy thereof. The present disclosure is not limited thereto, and the 2-2 electrode layer 974 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

When the piezoelectric layer 160 is formed, tensile stress may be applied to the piezoelectric layer 160 to prevent occurrence of defects due to migration of the materials (particles) constituting the 1-2 electrode layer 954.

Figure 34:
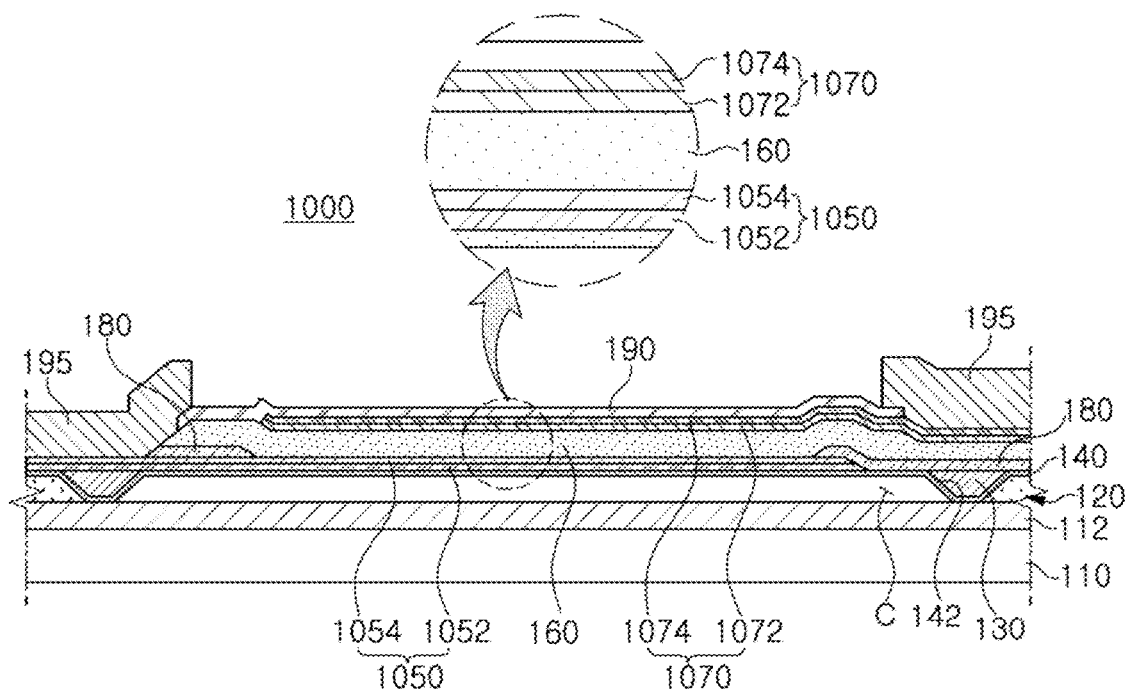
FIG. 34 is a schematic plan view illustrating an example of a bulk-acoustic wave resonator.

FIG. 34 is a schematic plan view illustrating an example of a bulk-acoustic wave resonator of the present disclosure.

Referring to FIG. 34, a bulk-acoustic wave resonator 1000 of the present disclosure may include a substrate 110, a sacrificial layer 120, an etching prevention portion 130, a membrane layer 140, a first electrode 1050, a piezoelectric layer 160, a second electrode 1070, an insertion layer 180, a passivation layer 190, and a metal pad 195, as one example.

The first electrode 1050 may be formed on the membrane layer 140, and a portion thereof may be disposed on an upper portion of the cavity C. In addition, the first electrode 1050 may be used as either an input electrode or an output electrode for inputting and outputting an electrical signal such as a radio frequency (RF) signal, and the like.

As one example, the first electrode 1050 may include a 1-1 electrode layer 1052 formed of an aluminum alloy material containing scandium (Sc), and a 1-2 electrode layer 1054 formed on the 1-1 electrode layer 1052.

The 1-2 electrode layer 1054 may be formed using a conductive material such as molybdenum (Mo), or an alloy thereof. The present disclosure is not limited thereto, and the 1-2 electrode layer 1054 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

The second electrode 1070 may be formed to cover at least a portion of the piezoelectric layer 160 disposed in a position above the cavity C. The second electrode 1070 may be used as either an input electrode or an output electrode for inputting and outputting an electrical signal such as a radio frequency (RF) signal, and the like. For example, in the example that the first electrode 1050 is used as an input electrode, the second electrode 1070 may be used as an output electrode, and in the example that the first electrode 1050 is used as an output electrode, the second electrode 1070 may be used as an input electrode.

The second electrode 1070 may include a 2-1 electrode layer 1072, and a 2-2 electrode layer 1074 disposed on the 2-1 electrode layer 1072 and formed of an aluminum alloy material containing scandium (Sc).

The 2-1 electrode layer 1072 may be formed using a conductive material such as molybdenum (Mo), or an alloy thereof. The present disclosure is not limited thereto, and the 2-1 electrode layer 1072 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

When the passivation layer 190 is formed, tensile stress of 0 to 500 MPa may be applied to the passivation layer 190 to prevent occurrence of defects due to migration of the materials (particles) constituting the 2-2 electrode layer 1074. In this example, the in-plane lattice constant of the passivation layer 190 may be greater than a value in a bulk state. For example, in the example that the passivation layer is aluminum nitride, or aluminum nitride containing a doping element, and the tensile stress is applied, the in-plane lattice constant may be greater, the out-of-plane lattice constant may be less, and a ratio (c/a) of lattice constants may be less than 1.58.

Figure 35:
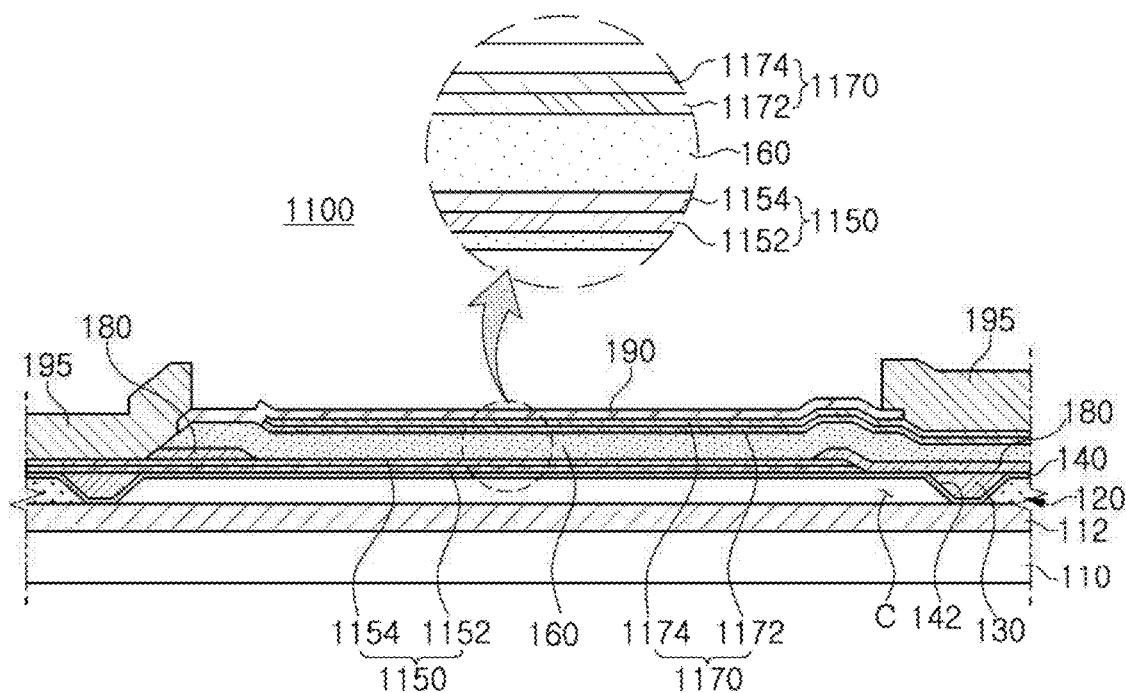
FIG. 35 is a schematic plan view illustrating an example of a bulk-acoustic wave resonator.

FIG. 35 is a schematic plan view illustrating an example of a bulk-acoustic wave resonator.

Referring to FIG. 35, a bulk-acoustic wave resonator 1100 of the present disclosure may include a substrate 110, a sacrificial layer 120, an etching prevention portion 130, a membrane layer 140, a first electrode 1150, a piezoelectric layer 160, a second electrode 1170, an insertion layer 180, a passivation layer 190, and a metal pad 195, as one example.

The first electrode 1150 may be formed on the membrane layer 140, and a portion thereof may be disposed on an upper portion of the cavity C. In addition, the first electrode 1150 may be used as either an input electrode or an output electrode for inputting and outputting an electrical signal such as a radio frequency (RF) signal, and the like.

As one example, the first electrode 1150 may include a 1-1 electrode layer 1152 formed of an aluminum alloy material containing scandium (Sc), and a 1-2 electrode layer 1154 formed on the 1-1 electrode layer 1152.

The 1-2 electrode layer 1154 may be formed using a conductive material such as molybdenum (Mo), or an alloy thereof. The present disclosure is not limited thereto, and the 1-2 electrode layer 1154 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

The second electrode 1170 may be formed to cover at least a portion of the piezoelectric layer 160 disposed in a position above the cavity C. The second electrode 1170 may be used as either an input electrode or an output electrode for inputting and outputting an electrical signal such as a radio frequency (RF) signal, and the like. For example, in the example that the first electrode 1150 is used as an input electrode, the second electrode 1170 may be used as an output electrode, and in the example that the first electrode 1150 is used as an output electrode, the second electrode 1170 may be used as an input electrode.

The second electrode 1170 may include a 2-1 electrode layer 1172 formed of an aluminum alloy material containing scandium (Sc), and a 2-2 electrode layer 1174 disposed on the 2-1 electrode layer 1172.

The 2-2 electrode layer 1174 may be formed using a conductive material such as molybdenum (Mo), or an alloy thereof. The present disclosure is not limited thereto, and the 2-2 electrode layer 1174 may be formed of a conductive material such as ruthenium (Ru), tungsten (W), iridium (Ir), platinum (Pt), copper (Cu), titanium (Ti), tantalum (Ta), nickel (Ni), chromium (Cr), and the like, or an alloy thereof.

Figure 36:
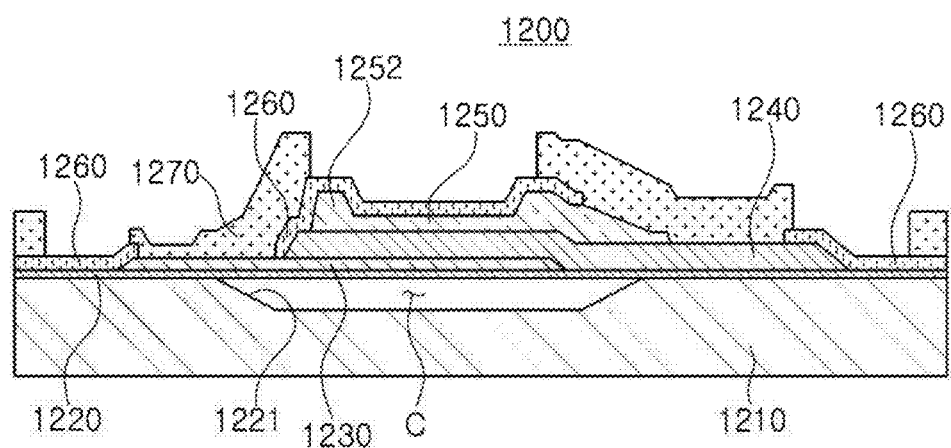
FIG. 36 is a schematic cross-sectional view illustrating an example of a bulk-acoustic wave resonator.

FIG. 36 is a schematic cross-sectional view illustrating an example of a bulk-acoustic wave resonator.

Referring to FIG. 36, a bulk-acoustic wave resonator 1200 of the present disclosure may include a substrate 1210, a membrane layer 1220, a first electrode 1230, a piezoelectric layer 1240, a second electrode 1250, a passivation layer 1260, and a metal pad 1270, as one example.

The substrate 1210 may be a substrate on which silicon is stacked. For example, a silicon wafer may be used as a substrate. The substrate 1210 may include a substrate protection layer 1212 disposed to be opposite to a cavity C.

The substrate protection layer 1212 may serve to prevent the substrate 1210 from being damaged when the cavity C is formed.

As an example, the substrate protection layer 1212 may be formed of any one or any combination of any two or more of silicon dioxide ($SiO_2$), silicon nitride ($Si_3N_4$), aluminum oxide ($Al_2O_3$), and aluminum nitride (AlN), and may be formed by any one or any combination of any two or more of a chemical vapor deposition process, a RF magnetron sputtering process, and an evaporation process.

The membrane layer 1220 may be formed on an upper portion of a sacrificial layer (not illustrated) to be finally removed, and the membrane layer 1220 may be formed by removing the sacrificial layer together with the substrate protection layer 1212. For example, a sacrificial layer (not illustrated) may be formed on the substrate 1210 for forming the cavity C, and then the cavity C may be formed by removing the sacrificial layer. As the membrane layer 1220, a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used.

Meanwhile, a seed layer (not illustrated) formed of aluminum nitride (AlN) may be formed on the membrane layer 1220. For example, the seed layer may be disposed between the membrane layer 1220 and the first electrode 1230. The seed layer may be formed using a dielectric or a metal having an HCP crystal structure in addition to aluminum nitride (AlN). As an example, in the example that the seed layer is a metal, the seed layer may be formed of titanium (Ti).

The first electrode 1230 may be formed on the membrane layer 1220. The first electrode 1230 may be used as either an input electrode or an output electrode for inputting and outputting an electrical signal such as a radio frequency (RF) signal, and the like.

The first electrode 1230 may be formed of an aluminum alloy material containing scandium (Sc) as an example. As described above, since the first electrode 1230 is formed of an aluminum alloy material containing scandium (Sc), mechanical strength may be increased, and high power reactive sputtering may also be achieved. Under such deposition conditions, an increase of a surface roughness of the first electrode 1230 may be prevented, and high orientation growth of the piezoelectric layer 1240 may be induced.

In addition, since the scandium (Sc) is contained to increase chemical resistance of the first electrode 1230, disadvantages occurring in the example that the first electrode is formed of pure aluminum may be supplemented. In addition, process stability such as a dry etching process or a wet etching process in manufacturing may be secured. Further, in the example that the first electrode is formed of pure aluminum, oxidation may be easily caused. Since the first electrode 1230 is formed of an aluminum alloy material containing scandium, the chemical resistance to oxidation may be improved.

The piezoelectric layer 1240 may be formed to cover at least a portion of the first electrode 1230. The piezoelectric layer 1240 may be a portion causing a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). In particular, in the example that the piezoelectric layer 1240 is formed of aluminum nitride (AlN), the piezoelectric layer 1240 may further include a rare earth metal. As an example, the rare earth metal may include any one or any combination of any two or more of scandium (Sc), erbium (Er), yttrium (Y), and lanthanum (La). In addition, as an example, the transition metal may include any one or any combination of any two or more of titanium (Ti), zirconium (Zr), hafnium (Hf), tantalum (Ta), and niobium (Nb). Magnesium (Mg), which is a divalent metal, may also be included.

Meanwhile, when the piezoelectric layer 1240 is stacked, tensile stress may be applied to the piezoelectric layer 1240. The tensile stress applied to the piezoelectric layer 1240 may be 0 to 500 MPa. When the tensile stress is applied, and the piezoelectric layer is aluminum nitride, or aluminum nitride containing a doping element, a ratio (c/a) of lattice constants may be less than 1.58. Since tensile stress may be applied to the piezoelectric layer 1240 such that a ratio (c/a) of lattice constants of the piezoelectric layer 1240 is made to be less than 1.58, occurrence of voids in the first electrode 1230 may be prevented. For example, migration of the materials (particles) constituting the first electrode 1230 may be prevented, and occurrence of surface defects may be prevented.

The second electrode 1250 may be formed to cover at least a portion of the piezoelectric layer 1240 disposed in a position above the cavity C. The second electrode 1250 may be used as either an input electrode or an output electrode for inputting and outputting an electrical signal such as a radio frequency (RF) signal, and the like. For example, in the example that the first electrode 1230 is used as an input electrode, the second electrode 1250 may be used as an output electrode, and in the example that the first electrode 1230 is used as an output electrode, the second electrode 1250 may be used as an input electrode.

The second electrode 1250 may be formed of an aluminum alloy material containing scandium (Sc), in a similar manner to the first electrode 1230.

Further, the second electrode 1250 may include a frame portion 1252 disposed at an edge of an active area, i.e., an area in which the first electrode 1230, the piezoelectric layer 1240, and the second electrode 1250 all overlap. The frame portion 1252 may have a thicker thickness than remaining portion of the second electrode 1250. For example, the frame portion 1252 may function to confine resonant energy within the active area by reflecting a lateral wave occurred during resonance into the active area.

The passivation layer 1260 may be formed in an area except for a portion of the first electrode 1230 and the second electrode 1250. The passivation layer 1260 may prevent damage of the second electrode 1250 and the first electrode 1230 during the manufacturing process.

Furthermore, the passivation layer 1260 may be adjusted in thickness of the passivation layer 1260 by etching for frequency control in the final process. The passivation layer 1260 may be formed of the same material as the material used for the membrane layer 1220. A dielectric layer containing any one of manganese oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO) may be used as one example.

When the passivation layer 1260 is stacked, tensile stress may be applied to the passivation layer 1260. The tensile stress applied to the passivation layer 1260 may be 0 to 500 MPa. In this example, the in-plane lattice constant of the passivation layer 1260 may be greater than a value in a bulk state. For example, in the example that the passivation layer is aluminum nitride, or aluminum nitride containing a doping element, and the tensile stress is applied, the in-plane lattice constant may be greater, the out-of-plane lattice constant may be less, and a ratio (c/a) of lattice constants may be less than 1.58. Therefore, since tensile stress may be applied to the passivation layer 1260, occurrence of voids in the first electrode 1230 and the second electrode 1250 may be prevented. For example, migration of the materials (particles) constituting the first electrode 1230 and the second electrode 1250 may be prevented, and occurrence of surface defects may be prevented.

The metal pad 1270 may be formed on a portion of the first electrode 1230 and the second electrode 1250 in which the passivation layer 1260 is not formed. As an example, the metal pad 1270 may be formed of a material such as gold (Au), a gold-tin (Au—Sn) alloy, copper (Cu), a copper-tin (Cu—Sn) alloy, aluminum (Al), an aluminum alloy, and the like. For example, the aluminum alloy may be an aluminum-germanium (Al—Ge) alloy.

Figure 37:
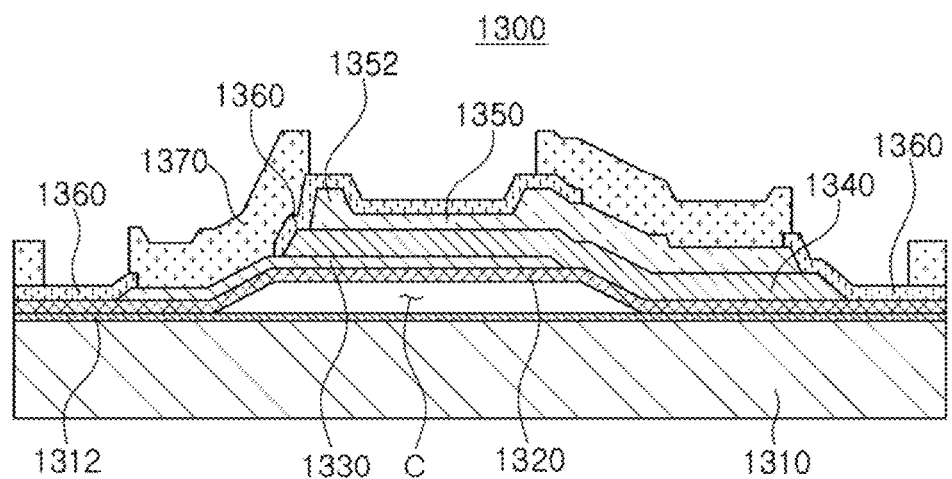
FIG. 37 is a schematic cross-sectional view illustrating an example of a bulk-acoustic wave resonator.

FIG. 37 is a schematic cross-sectional view illustrating an example of a bulk-acoustic wave resonator.

Referring to FIG. 37, an acoustic wave filter device 1300 of the present disclosure may include a substrate 1310, a membrane layer 1320, a first electrode 1330, a piezoelectric layer 1340, a second electrode 1350, a passivation layer 1360, and a metal pad 1370, as one example.

The substrate 1310 may be a substrate on which silicon is stacked. For example, a silicon wafer may be used as a substrate. The substrate 1310 may include a groove 1312 for forming a cavity C.

The groove 1312 may be formed in a central portion of the substrate 1310, and may be disposed in a position lower than a position of an active area. The active area may refer to an area in which the first electrode 1330, the piezoelectric layer 1340, and the second electrode 1350 all overlap.

The membrane layer 1320 may form the cavity C together with the substrate 1310. For example, the membrane layer 1320 may be formed to cover the groove 1312 of the substrate 1310. As the membrane layer 1320, a dielectric layer containing any one of silicon nitride (Si$_3$N$_4$), silicon oxide (SiO$_2$), manganese oxide (MgO), zirconium oxide (ZrO$_2$), aluminum nitride (AlN), lead zirconate titanate (PZT), gallium arsenide (GaAs), hafnium oxide (HfO$_2$), aluminum oxide (Al$_2$O$_3$), titanium oxide (TiO$_2$), and zinc oxide (ZnO) may be used.

Meanwhile, a seed layer (not illustrated) formed of aluminum nitride (AlN) may be formed on the membrane layer 1320. For example, the seed layer may be disposed between the membrane layer 1320 and the first electrode 1330. The seed layer may be formed using a dielectric or a metal having an HCP crystal structure in addition to aluminum nitride (AlN). As an example, in the example that the seed layer is a metal, the seed layer may be formed of titanium (Ti).

The first electrode 1330 may be formed on the membrane layer 1320. The first electrode 1330 may be used as either an input electrode or an output electrode for inputting and outputting an electrical signal such as a radio frequency (RF) signal, and the like.

The first electrode 1330 may be formed of an aluminum alloy material containing scandium (Sc) as an example. As described above, since the first electrode 1330 is formed of an aluminum alloy material containing scandium (Sc), mechanical strength may be increased, and high power reactive sputtering may also be achieved. Under such deposition conditions, an increase of a surface roughness of the first electrode 1330 may be prevented, and high orientation growth of the piezoelectric layer 1340 may be induced.

In addition, since the scandium (Sc) is contained to increase chemical resistance of the first electrode 1330, disadvantages occurring in the example that the first electrode is formed of pure aluminum may be supplemented. In addition, process stability such as a dry etching process or a wet etching process in manufacturing may be secured. Further, in the example that the first electrode is formed of pure aluminum, oxidation may be easily caused. Since the first electrode 1330 is formed of an aluminum alloy material containing scandium, the chemical resistance to oxidation may be improved.

The piezoelectric layer 1340 may be formed to cover at least a portion of the first electrode 1330. The piezoelectric layer 1340 may be a portion causing a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). In particular, in the example that the piezoelectric layer 1340 is formed of aluminum nitride (AlN), the piezoelectric layer 1340 may further include a rare earth metal. As an example, the rare earth metal may include any one or any combination of any two or more of scandium (Sc), erbium (Er), yttrium (Y), and lanthanum (La). In addition, as an example, the transition metal may include any one or any combination of any two or more of titanium (Ti), zirconium (Zr), hafnium (Hf), tantalum (Ta), and niobium (Nb). Magnesium (Mg), which is a divalent metal, may also be included.

Meanwhile, when the piezoelectric layer 1340 is stacked, tensile stress may be applied to the piezoelectric layer 1340. The tensile stress applied to the piezoelectric layer 1340 may be 0 to 500 MPa. When the tensile stress is applied, and the piezoelectric layer 1340 is aluminum nitride, or aluminum nitride containing a doping element, a ratio (c/a) of lattice constants may be less than 1.58. Since tensile stress may be applied such that a ratio (c/a) of lattice constants of the piezoelectric layer 1340 is made to be less than 1.58, occurrence of voids in the first electrode 1330 may be prevented. For example, migration of the materials (particles) constituting the first electrode 1330 may be prevented, and occurrence of surface defects may be prevented.

The second electrode 1350 may be formed to cover at least a portion of the piezoelectric layer 1340 disposed in a position above the cavity C. The second electrode 1350 may be used as either an input electrode or an output electrode for inputting and outputting an electrical signal such as a radio frequency (RF) signal, and the like. For example, in the example that the first electrode 1330 is used as an input electrode, the second electrode 1350 may be used as an output electrode, and in the example that the first electrode 1330 is used as an output electrode, the second electrode 1350 may be used as an input electrode.

The second electrode 1350 may be formed of an aluminum alloy material containing scandium (Sc), in a similar manner to the first electrode 1330.

Further, the second electrode 1350 may include a frame portion 1352 disposed at an edge of an active area. The frame portion 1352 may have a thicker thickness than remaining portion of the second electrode 1350. For example, the frame portion 1352 may function to confine resonant energy within the active area by reflecting a lateral wave occurred during resonance into the active area.

The passivation layer 1360 may be formed in an area except for a portion of the first electrode 1330 and the second electrode 1350. The passivation layer 1360 may prevent damage of the second electrode 1350 and the first electrode 1330 during the manufacturing process.

Furthermore, the passivation layer 1360 may be adjusted in thickness of the passivation layer 1360 by etching for frequency control in the final process. The passivation layer 1360 may be formed of the same material as the material used for the membrane layer 1320. A dielectric layer containing any one of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as one example.

Meanwhile, when the passivation layer 1360 is stacked, tensile stress may be applied to the passivation layer 1360. The tensile stress applied to the passivation layer 1360 may be 0 to 500 MPa. In this example, the in-plane lattice constant of the passivation layer 1360 may be greater than a value in a bulk state. For example, in the example that the passivation layer is aluminum nitride, or aluminum nitride containing a doping element, and the tensile stress is applied, the in-plane lattice constant may be greater, the out-of-plane lattice constant may be less, and a ratio (c/a) of lattice constants may be less than 1.58. Therefore, since tensile stress may be applied to the passivation layer 1360, occurrence of voids in the first electrode 1330 and the second electrode 1350 may be prevented. For example, migration of the materials (particles) constituting the first electrode 1330 and the second electrode 1350 may be prevented, and occurrence of surface defects may be prevented.

The metal pad 1370 may be formed on a portion of the first electrode 1330 and the second electrode 1350 in which the passivation layer 1360 is not formed. As an example, the metal pad 1370 may be formed of a material such as gold (Au), a gold-tin (Au—Sn) alloy, copper (Cu), a copper-tin (Cu—Sn) alloy, aluminum (Al), an aluminum alloy, and the like. For example, the aluminum alloy may be an aluminum-germanium (Al—Ge) alloy.

Figure 38:
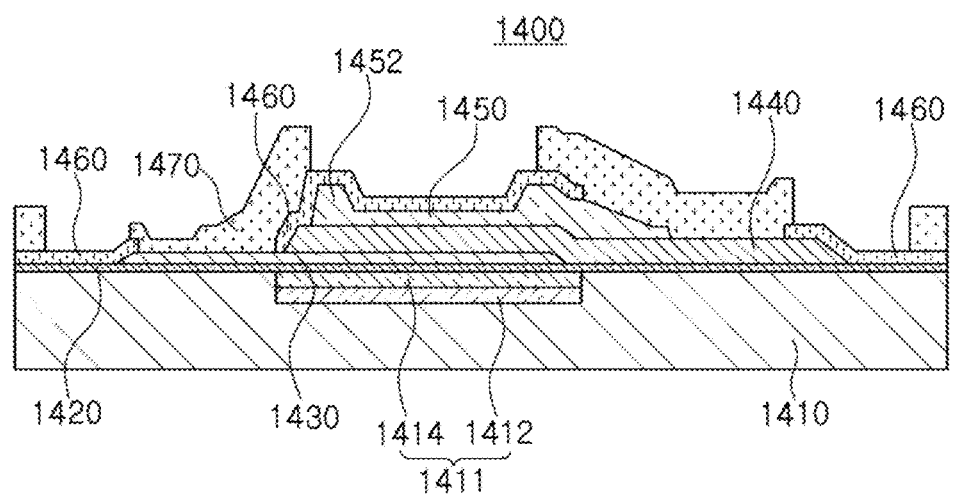
FIG. 38 is a schematic cross-sectional view illustrating an example of a bulk-acoustic wave resonator.

FIG. 38 is a schematic cross-sectional view illustrating an example of a bulk-acoustic wave resonator.

Referring to FIG. 38, a bulk-acoustic wave resonator 1400 of the present disclosure may include a substrate 1410, a membrane layer 1420, a first electrode 1430, a piezoelectric layer 1440, a second electrode 1450, a passivation layer 1460, and a metal pad 1470, as one example.

The substrate 1410 may be a substrate on which silicon is stacked. For example, a silicon wafer may be used as a substrate. The substrate 1410 may include a reflection layer 1411.

The reflection layer 1411 may be formed in a central portion of the substrate 1410, and may be disposed in a position lower than a position of an active area. The active area may refer to an area in which the first electrode 1430, the piezoelectric layer 1440, and the second electrode 1450 all overlap.

The reflection layer 1411 may include first and second reflection members 1412 and 1414 disposed in grooves. The first and second reflection members 1412 and 1414 may be formed of different materials.

The first reflection member 1412 may be formed using a conductive material such as molybdenum (Mo), or an alloy thereof. The present disclosure is not limited thereto, and ruthenium (Ru), tungsten (W), iridium (Ir), platinum (Pt), copper (Cu), titanium (Ti), tantalum (Ta), nickel (Ni), chromium (Cr), and the like, may be used. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the second reflection member 1414. Also, the first and second reflection members 1412 and 1414 may be formed only as a pair, or the first and second reflection members 1412 and 1414 may be repeatedly formed in a pair form.

The membrane layer 1420 may be formed to cover the reflection layer 1411 of the substrate 1410. A dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as the membrane layer 1420.

Meanwhile, a seed layer (not illustrated) formed of aluminum nitride (AlN) may be formed on the membrane layer 1420. For example, the seed layer may be disposed between the membrane layer 1420 and the first electrode 1430. The seed layer may be formed using a dielectric or a metal having an HCP crystal structure in addition to aluminum nitride (AlN). As an example, in the example that the seed layer is a metal, the seed layer may be formed of titanium (Ti).

The first electrode 1430 may be formed on the membrane layer 1420. The first electrode 1430 may be used as either an input electrode or an output electrode for inputting and outputting an electrical signal such as a radio frequency (RF) signal, and the like.

The first electrode 1430 may be formed of an aluminum alloy material containing scandium (Sc) as an example. As described above, since the first electrode 1430 is formed of an aluminum alloy material containing scandium (Sc), mechanical strength may be increased, and high power reactive sputtering may also be achieved. Under such deposition conditions, an increase of a surface roughness of the first electrode 1430 may be prevented, and high orientation growth of the piezoelectric layer 1440 may be induced.

In addition, since the scandium (Sc) is contained to increase chemical resistance of the first electrode 1430, disadvantages occurring in the example that the first electrode is formed of pure aluminum may be supplemented. In addition, process stability such as a dry etching process or a wet etching process in manufacturing may be secured. Further, in the example that the first electrode is formed of pure aluminum, oxidation may be easily caused. Since the first electrode 1430 is formed of an aluminum alloy material containing scandium, the chemical resistance to oxidation may be improved.

The piezoelectric layer 1440 may be formed to cover at least a portion of the first electrode 1430. The piezoelectric layer 1440 may be a portion causing a piezoelectric effect to convert electrical energy into mechanical energy in the form of an acoustic wave, and may be formed of any one of aluminum nitride (AlN), zinc oxide (ZnO), and lead zirconium titanium oxide (PZT; PbZrTiO). In particular, in the example that the piezoelectric layer 1440 is formed of aluminum nitride (AlN), the piezoelectric layer 1440 may further include a rare earth metal. As an example, the rare earth metal may include any one or any combination of any two or more of scandium (Sc), erbium (Er), yttrium (Y), and lanthanum (La). In addition, as an example, the transition metal may include any one or any combination of any two or more of titanium (Ti), zirconium (Zr), hafnium (Hf), tantalum (Ta), and niobium (Nb). Magnesium (Mg), which is a divalent metal, may also be included.

Meanwhile, when the piezoelectric layer 1440 is stacked, tensile stress may be applied to the piezoelectric layer 1440. The tensile stress applied to the piezoelectric layer 1440 may be 0 to 500 MPa. When the tensile stress is applied, and the piezoelectric layer 1440 is aluminum nitride, or aluminum nitride containing a doping element, a ratio (c/a) of lattice constants may be less than 1.58. Since tensile stress may be applied such that a ratio (c/a) of lattice constants of the piezoelectric layer 1440 is made to be less than 1.58, occurrence of voids in the first electrode 1430 may be prevented. For example, migration of the materials (particles) constituting the first electrode 1430 may be prevented, and occurrence of surface defects may be prevented.

The second electrode 1450 may be formed to cover at least a portion of the piezoelectric layer 1440 disposed in a position above the cavity C. The second electrode 1450 may be used as either an input electrode or an output electrode for inputting and outputting an electrical signal such as a radio frequency (RF) signal, and the like. For example, in the example that the first electrode 1430 is used as an input electrode, the second electrode 1450 may be used as an output electrode, and in the example that the first electrode 1430 is used as an output electrode, the second electrode 1450 may be used as an input electrode.

The second electrode 1450 may be formed of an aluminum alloy material containing scandium (Sc), in a similar manner to the first electrode 1430.

Further, the second electrode 1450 may include a frame portion 1452 disposed at an edge of an active area. The frame portion 1452 may have a thicker thickness than remaining portion of the second electrode 1450. For example, the frame portion 1452 may function to confine resonant energy within the active area by reflecting a lateral wave occurred during resonance into the active area.

The passivation layer 1460 may be formed in an area except for a portion of the first electrode 1430 and the second electrode 1450. The passivation layer 1460 may prevent damage of the second electrode 1450 and the first electrode 1430 during the manufacturing process.

Furthermore, the passivation layer 1460 may be adjusted in thickness of the passivation layer 1460 by etching for frequency control in the final process. The passivation layer 1460 may be formed of the same material as the material used for the membrane layer 1420. A dielectric layer containing any one of manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO) may be used as one example.

Meanwhile, when the passivation layer 1460 is stacked, tensile stress may be applied to the passivation layer 1460. The tensile stress applied to the passivation layer 1460 may be 0 to 500 MPa. In this example, the in-plane lattice constant of the passivation layer 1460 may be greater than a value in a bulk state. For example, in the example that the passivation layer is aluminum nitride, or aluminum nitride containing a doping element, and the tensile stress is applied, the in-plane lattice constant may be greater, the out-of-plane lattice constant may be less, and a ratio (c/a) of lattice constants may be less than 1.58. Therefore, since tensile stress may be applied to the passivation layer 1460, occurrence of voids in the first electrode 1430 and the second electrode 1450 may be prevented. For example, migration of the materials (particles) constituting the first electrode 1430 and the second electrode 1450 may be prevented, and occurrence of surface defects may be prevented.

The metal pad 1470 may be formed on a portion of the first electrode 1430 and the second electrode 1450 in which the passivation layer 1460 is not formed. As an example, the metal pad 1470 may be formed of a material such as gold (Au), a gold-tin (Au—Sn) alloy, copper (Cu), a copper-tin (Cu—Sn) alloy, aluminum (Al), an aluminum alloy, and the like. For example, the aluminum alloy may be an aluminum-germanium (Al—Ge) alloy.

Figure 39:
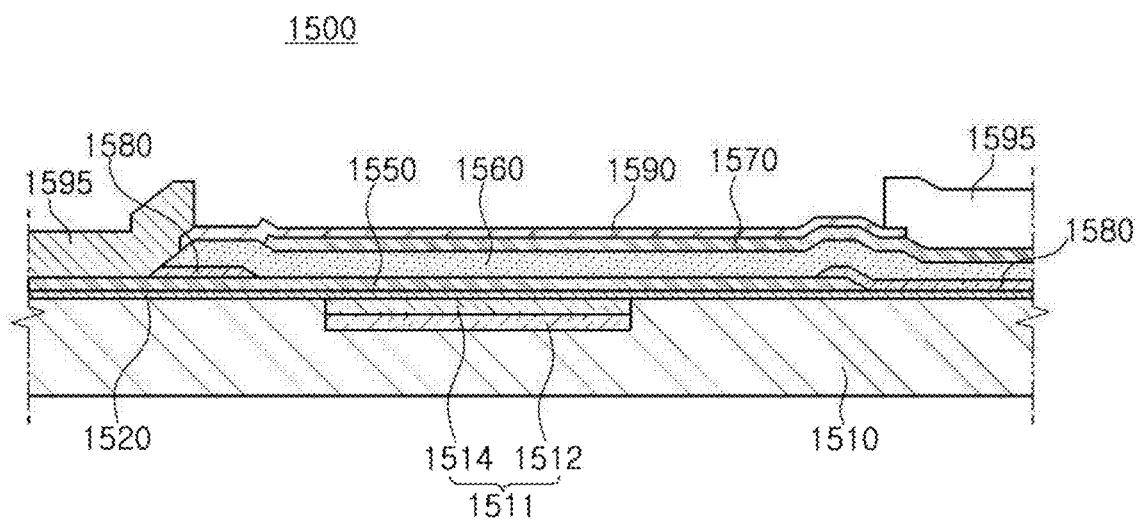
FIG. 39 is a schematic cross-sectional view illustrating an example of a bulk-acoustic wave resonator.

FIG. 39 is a schematic cross-sectional view illustrating an example of a bulk-acoustic wave resonator.

Referring to FIG. 39, a bulk-acoustic wave resonator 1500 of the present disclosure may include a substrate 1510, a membrane layer 1520, a first electrode 1550, a piezoelectric layer 1560, a second electrode 1570, an insertion layer 1580, a passivation layer 1590, and a metal pad 1595.

The substrate 1510 and the membrane layer 1520 included in the bulk-acoustic wave resonator 1500 according to the fifteenth example of the present disclosure may correspond to the components included in the bulk-acoustic wave resonator 1400 according to the fourteenth example of the present disclosure. Therefore, a detailed description thereof will be omitted hereinafter.

The first electrode 1550, the piezoelectric layer 1560, the second electrode 1570, the insertion layer 1580, and the passivation layer 1590, and the metal pad 1595 included in the bulk-acoustic wave resonator 1500 according to the fifteenth example of the present disclosure may be the same components as the first electrode 150, the piezoelectric layer 160, the second electrode 170, the insertion layer 180, the passivation layer 190, and the metal pad 195 included in the bulk-acoustic wave resonator 100 according to the first example of the present disclosure. Therefore, a detailed description thereof will be omitted hereinafter.

The insertion layer 1580 may be disposed between the first electrode 1550 and the piezoelectric layer 1560. The insertion layer 1580 may be formed of a dielectric, such as silicon oxide ($SiO_2$), aluminum nitride (AlN), aluminum oxide ($Al_2O_3$), silicon nitride ($Si_3N_4$), manganese oxide (MgO), zirconium oxide ($ZrO_2$), lead zirconate titanate (PZT), gallium arsenide (GaAs), hafnium oxide ($HfO_2$), aluminum oxide ($Al_2O_3$), titanium oxide ($TiO_2$), and zinc oxide (ZnO), but may be formed of a material different from those of the piezoelectric layer 1560. In addition, an area in which the insertion layer 1580 is provided may be formed as an air if necessary. This may be accomplished by removing the insertion layer 1580 during the manufacturing process.

In this example, a thickness of the insertion layer 1580 may be the same as or similar to a thickness of the first electrode 1550. The insertion layer 1580 may be formed to similar to the piezoelectric layer 1560, or may be formed to be thinner than the piezoelectric layer 1560. For example, the insertion layer 1580 may be formed to have a thickness of 100 Å or more, and may be formed to be thinner than a thickness of the piezoelectric layer 1560. The configuration of the present disclosure is not limited thereto.

Remaining structure of the insertion layer 1580 may be the same as that of the insertion layer 180 included in the bulk-acoustic wave resonator 100 according to the first example of the present disclosure. Therefore, a detailed description thereof is omitted.

While this disclosure includes specific examples, it will be apparent after an understanding of the disclosure of this application that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A bulk-acoustic wave resonator, comprising:
   a first electrode disposed on a substrate;
   a piezoelectric layer, of which at least a portion is disposed on the first electrode;
   a second electrode disposed on the piezoelectric layer; and
   a passivation layer disposed to cover the first electrode and the second electrode,
   wherein either one or both of the first electrode and the second electrode comprise an aluminum alloy layer, and
   either one or both of the piezoelectric layer and the passivation layer have aluminum nitride, or aluminum nitride added with a doping material, configured to have a ratio of an out-of-plane lattice constant "c" to an in-plane lattice constant "a" (c/a) of less than 1.58 and an applied tensile stress of 0 to 500 MPa,
   wherein the aluminum alloy layer contains scandium (Sc) which has a content of 0.1 to 5 at %.

2. The bulk-acoustic wave resonator according to claim 1, wherein the doping material of the piezoelectric layer and the passivation layer comprise one selected from the group consisting of scandium, erbium, yttrium, lanthanum, titanium, zirconium, and hafnium, or combinations thereof.

3. The bulk-acoustic wave resonator according to claim 2, wherein the content of the doping material of the piezoelectric layer and the passivation layer is 0.1 to 30 at %.

4. The bulk-acoustic wave resonator according to claim 1, wherein the either one or both of the piezoelectric layer and the passivation layer are subjected to tensile stress when stacked.

5. The bulk-acoustic wave resonator according to claim 1, wherein the first electrode and the second electrode both comprise an aluminum alloy layer containing scandium (Sc).

6. The bulk-acoustic wave resonator according to claim 1, wherein the first electrode comprises a layer formed of any one of, or a layer formed of an alloy comprising any one selected from the group consisting of, molybdenum (Mo), ruthenium (Ru), tungsten (W), iridium (Ir), platinum (Pt), copper (Ti), tantalum (Ta), nickel (Ni), and chromium (Cr), and
the second electrode comprises an aluminum alloy layer containing scandium (Sc).

7. The bulk-acoustic wave resonator according to claim 1, wherein the first electrode comprises an aluminum alloy layer containing scandium (Sc), and
the second electrode comprises a layer formed of any one of, or a layer formed of an alloy comprising any one selected from the group consisting of, molybdenum (Mo), ruthenium (Ru), tungsten (W), iridium (Ir), platinum (Pt), copper (Ti), tantalum (Ta), nickel (Ni), and chromium (Cr).

8. The bulk-acoustic wave resonator according to claim 5, wherein the first electrode comprises a 1-1 electrode layer comprising a layer formed of any one of, or a layer formed of an alloy comprising any one selected from the group consisting of, molybdenum (Mo), ruthenium (Ru), tungsten (W), iridium (Ir), platinum (Pt), copper (Ti), tantalum (Ta), nickel (Ni), and chromium (Cr), and a 1-2 electrode layer disposed in an upper portion of the 1-1 electrode layer and comprising an aluminum alloy layer containing scandium (Sc).

9. The bulk-acoustic wave resonator according to claim 5, wherein the first electrode comprises a 1-1 electrode layer comprising an aluminum alloy layer containing scandium (Sc), and a 1-2 electrode layer disposed in an upper portion of the 1-1 electrode layer and comprising a layer formed of any one of, or a layer formed of an alloy comprising any one selected from the group consisting of, molybdenum (Mo), ruthenium (Ru), tungsten (W), iridium (Ir), platinum (Pt), copper (Ti), tantalum (Ta), nickel (Ni), and chromium (Cr).

10. The bulk-acoustic wave resonator according to claim 5, wherein the second electrode comprises a 2-1 electrode layer comprising a layer formed of any one of, or a layer formed of an alloy comprising any one selected from the group consisting of, molybdenum (Mo), ruthenium (Ru), tungsten (W), iridium (Ir), platinum (Pt), copper (Ti), tantalum (Ta), nickel (Ni), and chromium (Cr), and a 2-2 electrode layer disposed in an upper portion of the 2-1 electrode layer and comprising an aluminum alloy layer containing scandium (Sc).

11. The bulk-acoustic wave resonator according to claim 5, wherein the second electrode comprises a 2-1 electrode layer comprising an aluminum alloy layer containing scandium (Sc), and a 2-2 electrode layer disposed in an upper portion of the 2-1 electrode layer and comprising a layer formed of any one of, or a layer formed of an alloy comprising any one selected from the group consisting of, molybdenum (Mo), ruthenium (Ru), tungsten (W), iridium (Ir), platinum (Pt), copper (Ti), tantalum (Ta), nickel (Ni), and chromium (Cr).

12. The bulk-acoustic wave resonator according to claim 8, wherein the second electrode comprises a 2-1 electrode layer comprising a layer formed of any one of, or a layer formed of an alloy comprising any one selected from the group consisting of, molybdenum (Mo), ruthenium (Ru), tungsten (W), iridium (Ir), platinum (Pt), copper (Ti), tantalum (Ta), nickel (Ni), and chromium (Cr), and a 2-2 electrode layer disposed in an upper portion of the 2-1 electrode layer and comprising an aluminum alloy layer containing scandium (Sc).

13. The bulk-acoustic wave resonator according to claim 9, wherein the second electrode comprises a 2-1 electrode layer comprising an aluminum alloy layer containing scandium (Sc), and a 2-2 electrode layer disposed in an upper portion of the 2-1 electrode layer and comprising a layer formed of any one of, or a layer formed of an alloy comprising any one selected from the group consisting of, molybdenum (Mo), ruthenium (Ru), tungsten (W), iridium (Ir), platinum (Pt), copper (Ti), tantalum (Ta), nickel (Ni), and chromium (Cr).

14. The bulk-acoustic wave resonator according to claim 9, wherein the second electrode comprises a 2-1 electrode layer comprising a layer formed of any one of, or a layer formed of an alloy comprising any one selected from the group consisting of, molybdenum (Mo), ruthenium (Ru), tungsten (W), iridium (Ir), platinum (Pt), copper (Ti), tantalum (Ta), nickel (Ni), and chromium (Cr), and a 2-2 electrode layer disposed in an upper portion of the 2-1 electrode layer and comprising an aluminum alloy layer containing scandium (Sc).

15. The bulk-acoustic wave resonator according to claim 8, wherein the second electrode comprises a 2-1 electrode layer comprising an aluminum alloy layer containing scandium (Sc), and a 2-2 electrode layer disposed in an upper portion of the 2-1 electrode layer and comprising a layer formed of any one of, or a layer formed of an alloy comprising any one selected from the group consisting of, molybdenum (Mo), ruthenium (Ru), tungsten (W), iridium (Ir), platinum (Pt), copper (Ti), tantalum (Ta), nickel (Ni), and chromium (Cr).

16. The bulk-acoustic wave resonator according to claim 1, wherein the doping material of the piezoelectric layer comprises one selected from the group consisting of scandium, erbium, yttrium, lanthanum, titanium, zirconium, and hafnium, or combinations thereof, and
the passivation layer is a dielectric layer containing any one of silicon nitride ($Si_3N_4$), silicon oxide ($SiO_2$), manganese oxide (MgO), zirconium oxide ($ZrO_2$), aluminum nitride (AlN), lead zirconate titanate (PZT), gallium arsenide (GaAs), hafnium oxide ($HfO_2$), aluminum oxide ($Al_2O_3$), titanium oxide ($TiO_2$), and zinc oxide (ZnO).

* * * * *